United States Patent
Usui

(10) Patent No.: US 9,215,389 B2
(45) Date of Patent: Dec. 15, 2015

(54) IMAGE PICKUP DEVICE, DIGITAL PHOTOGRAPHING APPARATUS USING THE IMAGE PICKUP DEVICE, AUTO-FOCUSING METHOD, AND COMPUTER-READABLE MEDIUM FOR PERFORMING THE AUTO-FOCUSING METHOD

(75) Inventor: Takafumi Usui, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 653 days.

(21) Appl. No.: 13/288,156

(22) Filed: Nov. 3, 2011

(65) Prior Publication Data
US 2012/0293706 A1 Nov. 22, 2012

(30) Foreign Application Priority Data
May 16, 2011 (KR) ........................ 10-2011-0045682

(51) Int. Cl.
H04N 5/232 (2006.01)
H04N 5/335 (2011.01)
H04N 5/369 (2011.01)
H04N 9/04 (2006.01)
H01L 27/146 (2006.01)

(52) U.S. Cl.
CPC ......... *H04N 5/3696* (2013.01); *H04N 5/23212* (2013.01); *H04N 5/335* (2013.01); *H04N 9/045* (2013.01); *H01L 27/14605* (2013.01); *H01L 27/14629* (2013.01); *H01L 27/14632* (2013.01)

(58) Field of Classification Search
None
See application file for complete search history.

(56) References Cited

U.S. PATENT DOCUMENTS

| 6,829,008 | B1 | 12/2004 | Saga et al. |
| 8,681,261 | B2 | 3/2014 | Oikawa |
| 8,730,373 | B2 | 5/2014 | Egawa |
| 2008/0259202 | A1* | 10/2008 | Fujii .............................. 348/345 |
| 2009/0090841 | A1 | 4/2009 | Kusaka |
| 2009/0115882 | A1 | 5/2009 | Kawarada |
| 2009/0122171 | A1 | 5/2009 | Suzuki |
| 2009/0140122 | A1 | 6/2009 | Suzuki |
| 2009/0153693 | A1 | 6/2009 | Onuki et al. |
| 2009/0153720 | A1 | 6/2009 | Suzuki et al. |
| 2009/0278966 | A1* | 11/2009 | Kusaka .......................... 348/294 |
| 2010/0013947 | A1* | 1/2010 | Oikawa ...................... 348/222.1 |
| 2010/0020015 | A1 | 1/2010 | Jung |
| 2010/0045849 | A1 | 2/2010 | Yamasaki |

(Continued)

FOREIGN PATENT DOCUMENTS

| JP | 09-043507 A | 2/1997 |
| JP | 2001-177756 A | 6/2001 |

(Continued)

*Primary Examiner* — Justin P Misleh
(74) *Attorney, Agent, or Firm* — Drinker Biddle & Reath LLP

(57) ABSTRACT

An image pickup device is provided including a plurality of pixels arranged over an entire region of the image pickup device, each pixel including: a plurality of light-receiving sub-pixels that generate an image pickup signal from incident light; and a phase-difference detection sub-pixel having a confined light-receiving region. The plurality of pixels includes first group pixels and second group pixels that are each classified according to an arrangement of the confined light-receiving region of the phase-difference detection sub-pixel thereof, and the confined light-receiving region of the phase-difference detection sub-pixel of the first group pixels and the confined light-receiving region of the phase-difference detection sub-pixel in the second group pixels are arranged biased to opposite directions.

14 Claims, 17 Drawing Sheets

(56) References Cited

U.S. PATENT DOCUMENTS

| | | | |
|---|---|---|---|
| 2010/0091161 A1* | 4/2010 | Suzuki | 348/302 |
| 2010/0110272 A1 | 5/2010 | Sugawara | |
| 2010/0194967 A1* | 8/2010 | Amano | 348/345 |
| 2010/0245631 A1* | 9/2010 | Hoda et al. | 348/241 |
| 2011/0096189 A1 | 4/2011 | Taniguchi | |
| 2011/0096211 A1 | 4/2011 | Oikawa et al. | |
| 2011/0109775 A1 | 5/2011 | Amano | |
| 2011/0164165 A1 | 7/2011 | Hashimoto et al. | |
| 2011/0164169 A1 | 7/2011 | Yamasaki | |

FOREIGN PATENT DOCUMENTS

| | | |
|---|---|---|
| JP | 2002-303785 A | 10/2002 |
| JP | 2003-241075 A | 8/2003 |
| JP | 3592147 B2 | 11/2004 |
| JP | 2006-154065 A | 6/2006 |
| JP | 2006-154506 A | 6/2006 |
| JP | 2007-155929 A | 6/2007 |
| JP | 2007-243744 A | 9/2007 |
| JP | 2007-317951 A | 12/2007 |
| JP | 2008-287123 A | 11/2008 |
| JP | 2008-299184 A | 12/2008 |
| JP | 2008-312073 A | 12/2008 |
| JP | 2009-042555 A | 2/2009 |
| JP | 2009-042556 A | 2/2009 |
| JP | 2009-044534 A | 2/2009 |
| JP | 2009-044535 A | 2/2009 |
| JP | 2009-063921 A | 3/2009 |
| JP | 2009-089105 A | 4/2009 |
| JP | 2009-089144 A | 4/2009 |
| JP | 2009-099817 A | 5/2009 |
| JP | 2009-109965 A | 5/2009 |
| JP | 2009-115893 A | 5/2009 |
| JP | 2009-124313 A | 6/2009 |
| JP | 2009-141390 A | 6/2009 |
| JP | 2009-147665 A | 7/2009 |
| JP | 2009-163220 A | 7/2009 |
| JP | 2009-175528 A | 8/2009 |
| JP | 2009-217252 A | 9/2009 |
| JP | 2009-224913 A | 10/2009 |
| JP | 2009-232288 A | 10/2009 |
| JP | 2009-244429 A | 10/2009 |
| JP | 2009-258451 A | 11/2009 |
| JP | 2009-276426 A | 11/2009 |
| JP | 2010-014788 A | 1/2010 |
| JP | 2010-016762 A | 1/2010 |
| JP | 2010-020015 A | 1/2010 |
| JP | 2010-020016 A | 1/2010 |
| JP | 2010-020055 A | 1/2010 |
| JP | 2010-049209 A | 3/2010 |
| JP | 2010-062640 A | 3/2010 |
| JP | 2010-093757 A | 4/2010 |
| JP | 2010107771 A | 5/2010 |
| JP | 2010113073 A | 5/2010 |
| JP | 2010117679 A | 5/2010 |
| WO | 2007/011026 A1 | 1/2007 |

* cited by examiner

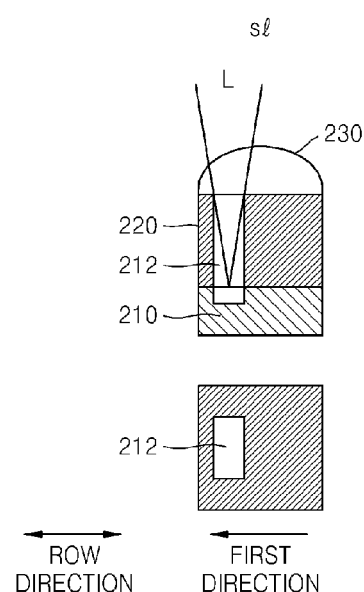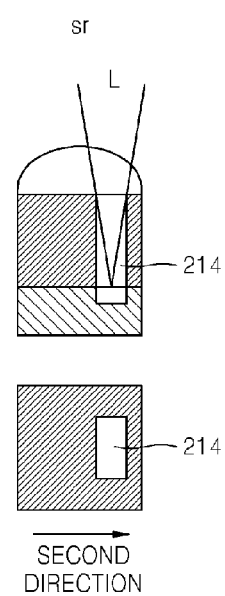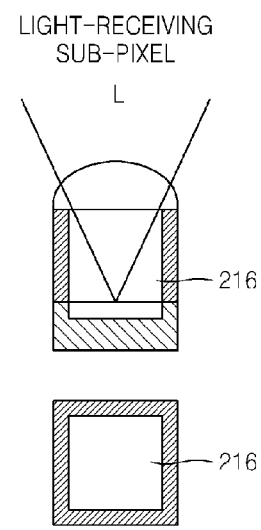
FIG. 2A  FIG. 2B  FIG. 2C
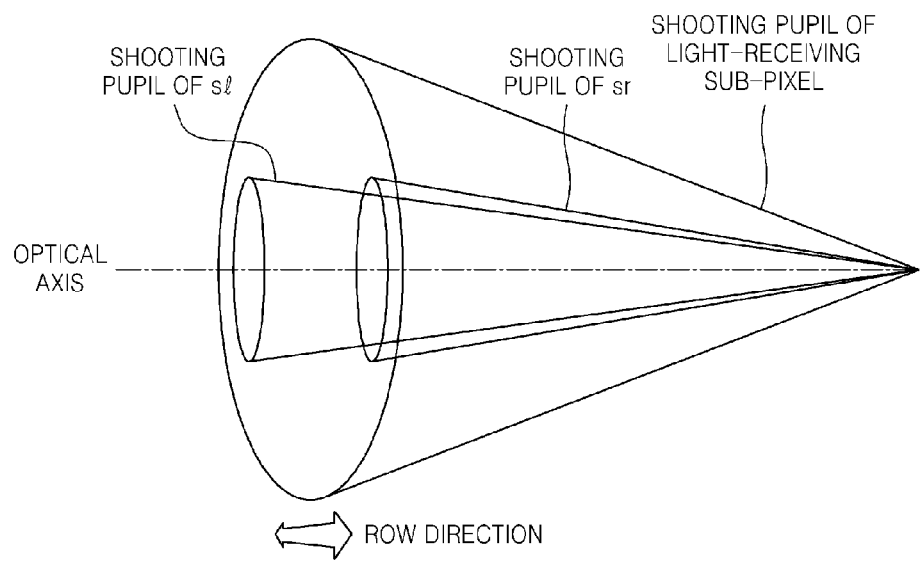
FIG. 3

FIG. 4A    FIG. 4B    FIG. 4C

| R | G |
|---|---|
| S | B |

| R | B |
|---|---|
| S | G |

| R | S |
|---|---|
| G | B |

FIG. 4D    FIG. 4E    FIG. 4F

| R | G |
|---|---|
| B | S |

| R | B |
|---|---|
| G | S |

| R | S |
|---|---|
| B | G |

FIG. 5A

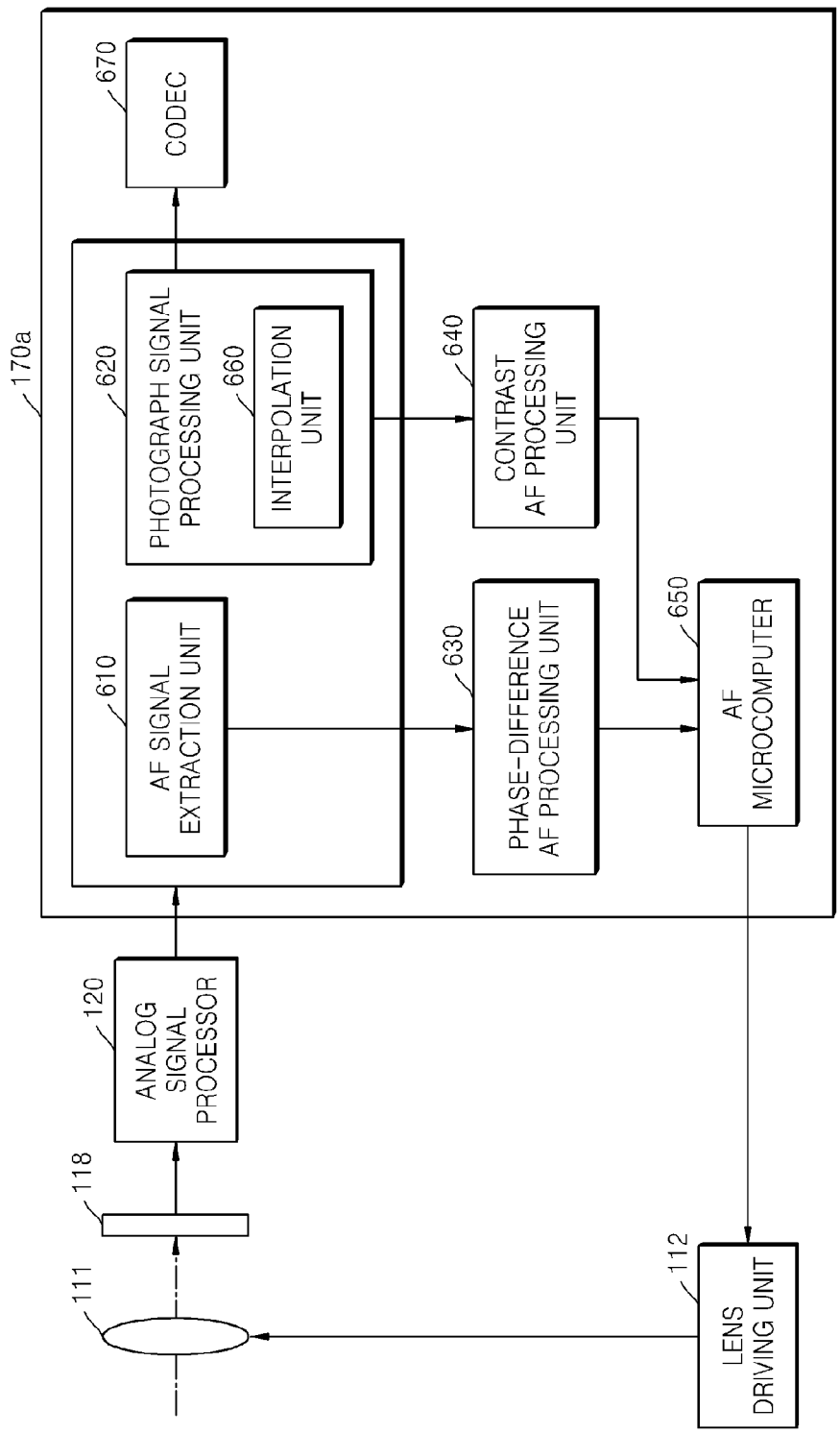

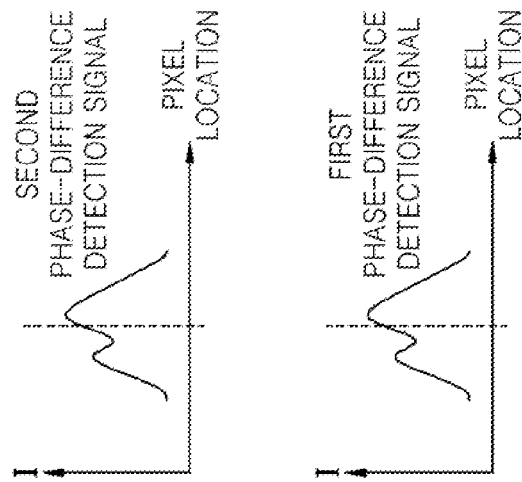
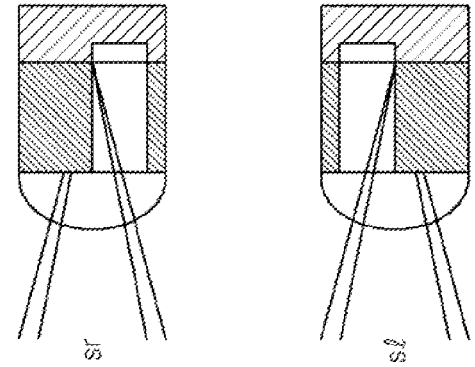
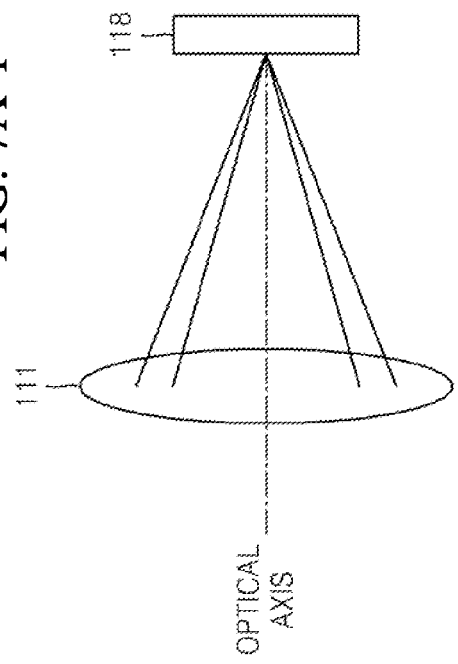

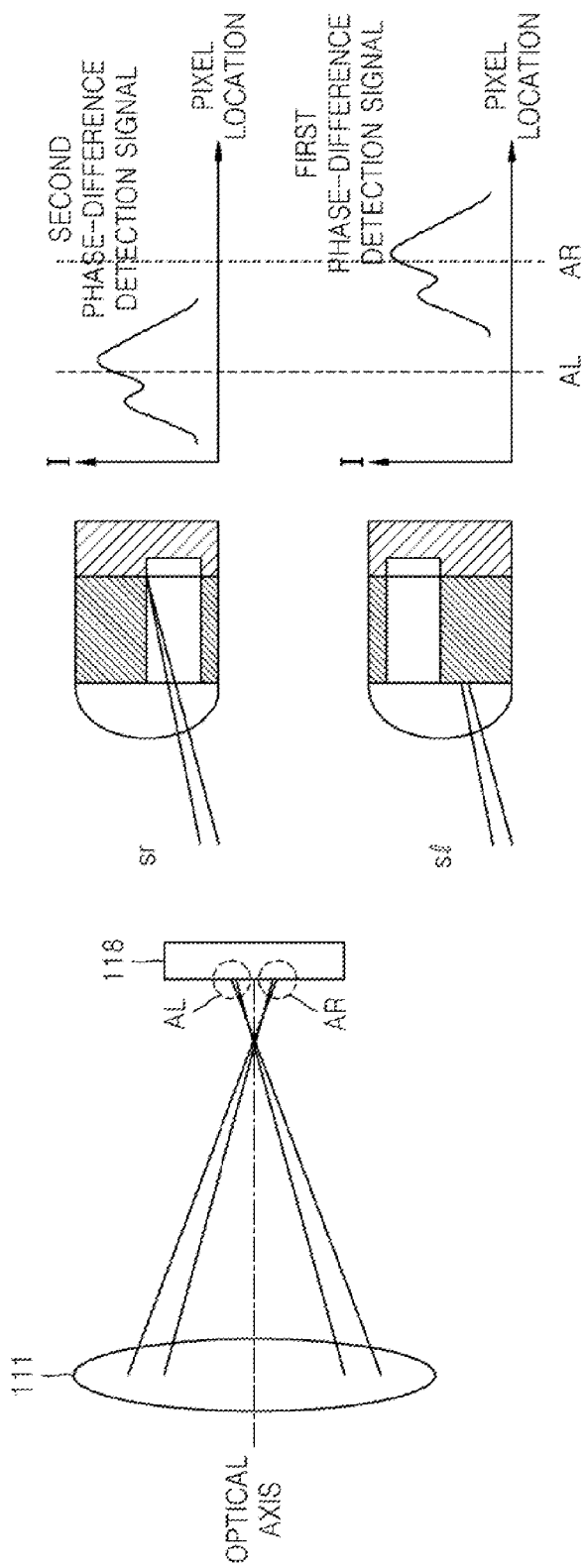

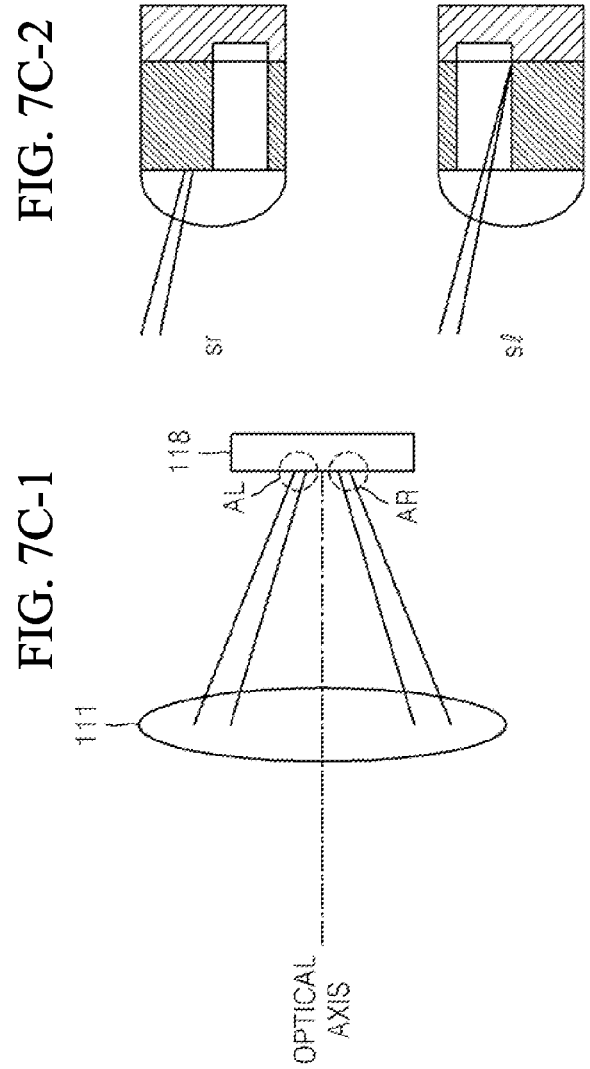

IMAGE PICKUP DEVICE, DIGITAL PHOTOGRAPHING APPARATUS USING THE IMAGE PICKUP DEVICE, AUTO-FOCUSING METHOD, AND COMPUTER-READABLE MEDIUM FOR PERFORMING THE AUTO-FOCUSING METHOD

CROSS-REFERENCE TO RELATED PATENT APPLICATION

This application claims the benefit of Korean Patent Application No. 10-2011-0045682, filed on May 16, 2011, in the Korean Intellectual Property Office, the disclosure of which is incorporated herein in its entirety by reference.

BACKGROUND

The present invention relates to an image pickup device, a digital photographing device using the image pickup device, an auto-focusing method, and a computer-readable storage medium for performing the auto-focusing method.

Auto-focusing (AF) systems are widely used in photographing apparatuses such as digital compact cameras, lens-changeable cameras, camcorders, or the like. AF systems may be classified into either phase difference AF systems using phase difference detection or contrast AF systems using contrast detection.

A phase difference AF system includes a phase difference AF sensor separate from an image pickup device, and performs AF using a defocus amount of a lens calculated from an output of the phase difference AF sensor. For phase difference AF, an additional mirror for the phase difference AF is required. For example, to apply phase difference AF to a digital single lens reflection (DSLR) camera, a sub-mirror for guiding incident light onto the phase difference AF sensor is further used along with a main mirror. Phase difference AF ensures high-speed, high-performance AF, but is costly due to an extra optical system needed for the phase difference AF.

A contrast AF system extracts high-frequency data from image data output from an image pickup device and controls AF to maximize the high-frequency component. To this end, the contrast AF system requires a signal processing circuit, but no extra sensor or optical system, and thus may be established at relatively low costs. However, the contrast AF system is low in speed and precision relative to phase difference AF systems.

SUMMARY

Various embodiments of the present invention perform phase difference auto-focusing (AF) without using either an extra phase difference AF sensor or optical system. These perform uniform interpolation over the entire pixel region of an image pickup device including phase-difference detection sub-pixels, thereby avoiding an image quality degradation even with the phase-difference sub-pixels arranged in the image pickup device. They also define a confined light-receiving region of phase-difference detection sub-pixels that are biased to a direction according to a pixel region of an image pickup device, thereby improving auto-focusing performance on outer pixels.

According to an embodiment of the present invention, there is provided an image pickup device including a plurality of pixels arranged over an entire region of the image pickup device, each pixel including: a plurality of light-receiving sub-pixels that generate an image pickup signal from incident light; and a phase-difference detection sub-pixel having a confined light-receiving region, wherein the plurality of pixels may include first group pixels and second group pixels that are each classified according to an arrangement of the confined light-receiving region of the phase-difference detection sub-pixel thereof, and the confined light-receiving region of the phase-difference detection sub-pixel of the first group pixels and the confined light-receiving region of the phase-difference detection sub-pixel in the second group pixels may be arranged biased to opposite directions.

The confined light-receiving region of the first group pixels may be arranged biased to a first direction defined along a row direction, the confined light-receiving region of the second group pixels may be arranged biased to a second direction opposite to the first direction, and the first group pixels and the second group pixels may be each consecutively arranged in the row direction as a group, and the groups of the first group pixels and the second group pixels may alternate in a column direction.

The plurality of pixels may further include third group pixels and fourth group pixels that are each classified according to an arrangement of the confined light-receiving region of the phase-difference detection sub-pixel thereof, the confined light-receiving region of the third group pixels may be arranged biased further to the first direction relative to the confined light-receiving region of the first group pixels, the confined light-receiving region of the fourth group pixels may be arranged biased further to the second direction relative to the confined light-receiving region of the second group pixels, and the third group pixels and the fourth group pixels may be each consecutively arranged in the row direction as a group, and the groups of the first group pixels, the second group pixels, the third group pixels, and the fourth group pixels alternate in the column direction.

The plurality of pixels may further include fifth group pixels and sixth group pixels that are each classified according to an arrangement of the confined light-receiving region of the phase-difference detection sub-pixel thereof, the confined light-receiving region of the first group pixels may be arranged biased to a first direction defined along a row direction, the confined light-receiving region of the second group pixels may be arranged biased to a second direction opposite to the first direction, the confined light-receiving region of the fifth group pixels may be arranged biased to a third direction defined along a column direction perpendicular to the row direction, and the confined light-receiving region of the sixth group pixels may be arranged biased to a fourth direction opposite to the third direction. The image pickup device may include: a plurality of first regions in which the first group pixels and the second group pixels are arranged; and a plurality of second regions in which the fifth group pixels and the sixth group pixels are arranged. The first group pixels and the second group pixels may be each consecutively arranged in the row direction in the first regions as a group, and the groups of the first group pixels and the second group pixels may alternate in the column direction in the first regions. The fifth group pixels and the sixth group pixels may be each consecutively arranged in the column direction in the second regions as a group, and the groups of the fifth group pixels and the sixth group pixels may alternate in the row direction in the second regions.

The confined light-receiving region of the phase-difference detection sub-pixel of the first group pixels may be arranged in a center of the corresponding phase-difference detection sub-pixel, or may be arranged biased to a first direction defined along a row direction. The confined light-receiving region of the phase-difference detection sub-pixel of the second group pixels may be arranged in a center of the corresponding phase-difference detection sub-pixel, or may be arranged biased to a second direction opposite to the first direction. The confined light-receiving region of the phase-difference detection sub-pixel of the first group pixels may be arranged in a center of the corresponding phase-difference detection sub-pixel if the corresponding phase-difference detection sub-pixel is in a region of the image pickup device biased to the first direction from an optical axis, and may be arranged biased to the first direction if the corresponding phase-difference detection sub-pixel is in a region of the image pickup device biased to the second direction from the optical axis. The confined light-receiving region of the phase-difference detection sub-pixel of the second group pixels may be arranged in a center of the corresponding phase-difference detection sub-pixel if the corresponding phase-difference detection sub-pixel is in a region of the image pickup device biased to the second direction from the optical axis, and may be arranged biased to the second direction if the corresponding phase-difference detection sub-pixel is in a region of the image pickup device biased to the first direction from the optical axis.

The plurality of pixels may further include fifth group pixels and sixth group pixels that are each classified according to an arrangement of the confined light-receiving region of the phase-difference detection sub-pixel thereof. The confined light-receiving region of the phase-difference detection sub-pixel of the first group pixels may be arranged in a center of the corresponding phase-difference detection sub-pixel, or may be arranged biased to a first direction defined along a row direction. The confined light-receiving region of the phase-difference detection sub-pixel of the second group pixels may be arranged in a center of the corresponding phase-difference detection sub-pixel, or may be arranged biased to a second direction opposite to the first direction. The confined light-receiving region of the phase-difference detection sub-pixel of the fifth group pixels may be arranged in a center of the corresponding phase-difference detection sub-pixel, or may be arranged biased to a third direction defined along a column direction perpendicular to the row direction. The confined light-receiving region of the phase-difference detection sub-pixel of the sixth group pixels may be arranged in a center of the corresponding phase-difference detection sub-pixel, or may be arranged biased to a fourth direction opposite to the third direction.

The confined light-receiving region of the phase-difference detection sub-pixel of the first group pixels may be arranged in a center of the corresponding phase-difference detection sub-pixel if the phase-difference detection sub-pixel is in a region of the image pickup device biased to the first direction from an optical axis, and may be arranged biased to the first direction if the phase-difference detection sub-pixel is in a region of the image pickup device biased to the second direction from the optical axis. The confined light-receiving region of the phase-difference detection sub-pixel of the second group pixels may be arranged in a center of the corresponding phase-difference detection sub-pixel if the phase-difference detection sub-pixel is in a region of the image pickup device biased to the second direction from an optical axis, and may be arranged biased to the second direction if the phase-difference detection sub-pixel is in a region of the image pickup device biased to the first direction from the optical axis. The confined light-receiving region of the phase-difference detection sub-pixel of the fifth group pixels may be arranged in a center of the corresponding phase-difference detection sub-pixel if the phase-difference detection sub-pixel is in a region of the image pickup device biased to the third direction from the optical axis, and may be arranged biased to the third direction if the phase-difference detection sub-pixel is in a region of the image pickup device biased to the fourth direction from the optical axis. The confined light-receiving region of the phase-difference detection sub-pixel of the sixth group pixels may be arranged in a center of the corresponding phase-difference detection sub-pixel if the phase-difference detection sub-pixel is in a region of the image pickup device biased to the fourth direction from the optical axis, and may be arranged biased to the fourth direction if the phase-difference detection sub-pixel is in a region of the image pickup device biased to the third direction from the optical axis.

The plurality of light-receiving sub-pixels may be larger in size than the phase-difference detection sub-pixel, and each light-receiving sub-pixel may have a light-receiving region in a center thereof.

The plurality of light-receiving sub-pixels and the phase-difference detection sub-pixel may each include: a photodiode layer for photoelectrically converting incident light; a mask layer including a predetermined aperture for defining the confined light-receiving regions and formed on the photodiode layer; and a microlens for focusing incident light and formed in the mask layer.

According to another aspect, there is provided a digital photographing apparatus including: an optical system for focusing light incident from a subject; an image pickup device that photoelectrically converts the light incident through the optical system and includes a plurality of pixels; and a phase-difference auto-focusing (AF) unit for determining whether a current state is an in-focus state from a phase-difference detection signal generated by the image pickup device, wherein the image pickup device may include a plurality of pixels arranged over an entire region of the image pickup device, each pixel including: a plurality of light-receiving sub-pixels that generate an image pickup signal from incident light; and a phase-difference detection sub-pixel having a confined light-receiving region and for generating and outputting the phase-difference detection signal. The plurality of pixels may include first group pixels and second group pixels that each are classified according to an arrangement of the confined light-receiving region of the phase-difference detection sub-pixel thereof, and the confined light-receiving region of the phase-difference detection sub-pixel of the first group pixels and the confined light-receiving region of the phase-difference detection sub-pixel in the second group pixels may be arranged biased to opposite directions.

The phase-difference AF processing unit may determine whether the current state is in the in-focus state by detecting magnitudes of the phase-difference detection signals of the first group pixels and the second group pixels according to pixel regions of the image pickup device, and may determine a direction in which to move a lens to be in the in-focus state.

The confined light-receiving region of the first group pixels may be arranged biased to a first direction defined along a row direction, the confined light-receiving region of the second group pixels may be arranged biased to a second direction opposite to the first direction, and the first group pixels and the second group pixels may each be consecutively arranged in the row direction as a group, and the groups of the first group pixels and the second group pixels alternate in a column direction. The phase-difference AF processing unit may determine that the current state is in the in-focus state if, in a region of the image pickup device that is on an optical axis, the phase-difference detection signal of the first group pixels and the phase-difference detection signal of the second group pixels are detected to be greater than or equal to a critical level. If either the phase-difference detection signal of the first group pixels or the phase-difference detection signal of the second group pixels is detected to be less than the critical level, the phase-difference AF processing unit may determine that the current state is in a front focus state if, in a region of the image pickup device biased to the first direction from the optical axis, the phase-difference detection signal of the second group pixels is detected to be greater than or equal to the critical level, and the phase-difference detection signal of the first group pixels may be detected to be less than the critical level; and determines that the current state is in a back focus state if, in the region of the image pickup device biased to the first direction from the optical axis, the phase-difference detection signal of the first group pixels is detected to be greater than or equal to the critical level, and the phase-difference detection signal of the second group pixels is detected to be less than the critical level.

The plurality of pixels may further include third group pixels and fourth group pixels that each are classified according to an arrangement of the confined light-receiving region of the phase-difference detection sub-pixel thereof, the confined light-receiving region of the third group pixels may be arranged biased further to the first direction relative to the confined light-receiving region of the first group pixels, and the confined light-receiving region of the fourth group pixels may be arranged biased further to the second direction relative to the confined light-receiving region of the second group pixels, wherein the phase-difference AF processing unit may determine whether the current state is in the in-focus state using the phase-difference detection signals of the first group pixels and the second group pixels in a first focal distance region, and using the phase-difference detection signals of the third group pixels and the fourth group pixels in a second focal distance region with a focal distance shorter than that in the first focal distance region.

The plurality of pixels may further include fifth group pixels and sixth group pixels that are each classified according to an arrangement of the confined light-receiving region of the phase-difference detection sub-pixel thereof, the confined light-receiving region of the first group pixels may be arranged biased to a first direction defined along a row direction, the confined light-receiving region of the second group pixels may be arranged biased to a second direction opposite to the first direction, the confined light-receiving region of the fifth group pixels may be arranged biased to a third direction defined along a column direction perpendicular to the row direction, and the confined light-receiving region of the sixth group pixels may be arranged biased to a fourth direction opposite to the third direction. The phase-difference AF processing unit may determine that the current state is in the in-focus state if, in a region of the image pickup device that is on an optical axis, the phase-difference detection signals of the first, second, fifth and sixth group pixels are detected to be greater than or equal to a critical level. If the phase-difference detection signals of the first, second, fifth and sixth group pixels are detected to be less than the critical level, the phase-difference AF processing unit may determine that the current state is in a front focus state if, in a region of the image pickup device biased to the first direction from the optical axis, the phase-difference detection signal of the second group pixels is detected to be greater than or equal to the critical level, and the phase-difference detection signal of the first group pixels is detected to be less than the critical level; the phase-difference AF processing unit may determine that the current state is in the front focus state if, in a region of the image pickup device biased to the third direction from the optical axis, the phase-difference detection signal of the sixth group pixels is detected to be greater than or equal to the critical level, and the phase-difference detection signal of the fifth group pixels is detected to be less than the critical level; the phase-difference AF processing unit may determine that the current state is in a back focus state if, in the region of the image pickup device biased to the first direction from the optical axis, the phase-difference detection signal of the first group pixels is detected to be greater than or equal to the critical level, and the phase-difference detection signal of the second group pixels is detected to be less than the critical level; and the phase-difference AF processing unit may determine that the current state is in the back focus state if, in the region of the image pickup device biased to the third direction from the optical axis, the phase-difference detection signal of the fifth group pixels is detected to be greater than or equal to the critical level, and the phase-difference detection signal of the sixth group pixels is detected to be less than the critical level.

The digital photographing apparatus may further include an interpolation unit for performing interpolation on the plurality of light-receiving sub-pixels and the phase-difference detection sub-pixel, wherein the plurality of light-receiving sub-pixels may be of different colors, and the interpolation unit may perform interpolation on the light receiving sub-pixels of the same color using neighboring pixels of the same pattern over the entire region of the image pickup device, and may perform interpolation on the phase-difference detection sub-pixels using neighboring pixels of the same pattern over the entire region of the image pickup device.

The digital photographing apparatus may further include: a contrast AF processing unit for extracting contrast information from an image pickup signal generated by a plurality of the light-receiving sub-pixels and determining whether the current state is in the in-focus state using the contrast information; and a lens driving unit for driving a lens of the optical system according to a result of the in-focus state determination by the phase-difference AF processing unit and a result of the in-focus state determination by the contrast AF processing unit.

According to another aspect, there is provided an auto-focusing method of a digital photographing apparatus including an image pickup device, the image pickup device including a plurality of pixels arranged over an entire region of the image pickup device, each pixel including: a plurality of light-receiving sub-pixels that generate an image pickup signal from incident light; and a phase-difference detection sub-pixel having a confined light-receiving region and for generating and outputting the phase-difference detection signal, wherein the plurality of pixels may include first group pixels and second group pixels that are each classified according to an arrangement of the confined light-receiving region of the phase-difference detection sub-pixel thereof, and the confined light-receiving region of the phase-difference detection sub-pixel of the first group pixels and the confined light-receiving region of the phase-difference detection sub-pixel in the second group pixels may be arranged biased to opposite directions, the auto-focusing method including: determining whether the current state is in an in-focus state by detecting magnitudes of the phase-difference detection signals of the first group pixels and the second group pixels according to pixel regions of the image pickup device; and determining whether the current state is in a front focus state or in a back focus state if the current state is not in the in-focus state.

The confined light-receiving region of the first group pixels may be arranged biased to a first direction defined along a row direction; the confined light-receiving region of the second group pixels may be arranged biased to a second direction opposite to the first direction; and the first group pixels and the second group pixels may be each consecutively arranged in the row direction as a group, and the groups of the first group pixels and the second group pixels may alternate in a column direction, the auto-focusing method further including: determining that the current state is in the in-focus state if, in a region of the image pickup device that is on an optical axis, the phase-difference detection signal of the first group pixels and the phase-difference detection signal of the second group pixels are detected to be greater than or equal to a critical level; and if, in the region of the image pickup device that is on the optical axis, the phase-difference detection signal of the first group pixels and the phase-difference detection signal of the second group pixels are detected to be less than the critical level, determining that the current state is in the front focus state if, in a region of the image pickup device biased to the first direction from the optical axis, the phase-difference detection signal of the second group pixels is detected to be greater than or equal to the critical level, and the phase-difference detection signal of the first group pixels is detected to be less than the critical level, and determining that the current state is in the back focus state if, in the region of the image pickup device biased to the first direction from the optical axis, the phase-difference detection signal of the first group pixels is detected to be greater than or equal to the critical level, and the phase-difference detection signal of the second group pixels is detected to be less than the critical level.

The plurality of pixels may further include third group pixels and fourth group pixels that are each classified according to an arrangement of the confined light-receiving region of the phase-difference detection sub-pixel thereof; the confined light-receiving region of the third group pixels may be arranged biased further to the first direction relative to the confined light-receiving region of the first group pixels; and the confined light-receiving region of the fourth group pixels may be arranged biased further to the second direction relative to the confined light-receiving region of the second group pixels, the auto-focusing method further including: determining whether the current state is in the in-focus state using the phase-difference detection signals of the first group pixels and the second group pixels in a first focal distance region; and determining whether the current state is in the in-focus state using the phase-difference detection signals of the third group pixels and the fourth group pixels in a second focal distance region with a focal distance shorter than that in the first focal distance region.

The plurality of pixels may further include fifth group pixels and sixth group pixels that each are classified according to an arrangement of the confined light-receiving region of the phase-difference detection sub-pixel thereof; the confined light-receiving region of the first group pixels may be arranged biased to a first direction defined along a row direction; the confined light-receiving region of the second group pixels may be arranged biased to a second direction opposite to the first direction; the confined light-receiving region of the fifth group pixels may be arranged biased to a third direction defined along a column direction perpendicular to the row direction; and the confined light-receiving region of the sixth group pixels may be arranged biased to a fourth direction opposite to the third direction, the auto-focusing method further including: determining that the current state is in the in-focus state if, in a region of the image pickup device that is on an optical axis, the phase-difference detection signals of the first, second, fifth and sixth group pixels are detected to be greater than or equal to a critical level; and if, in the region of the image pickup device that is on the optical axis, the phase-difference detection signals of the first, second, fifth and sixth group pixels are detected to be less than the critical level, determining that the current state is in the front focus state if, in a region of the image pickup device biased to the first direction from the optical axis, the phase-difference detection signal of the second group pixels is detected to be greater than or equal to the critical level, and the phase-difference detection signal of the first group pixels is detected to be less than the critical level, determining that the current state is in the front focus state if, in a region of the image pickup device biased to the third direction from the optical axis, the phase-difference detection signal of the sixth group pixels is detected to be greater than or equal to the critical level, and the phase-difference detection signal of the fifth group pixels is detected to be less than the critical level, determining that the current state is in the back focus state if, in the region of the image pickup device biased to the first direction from the optical axis, the phase-difference detection signal of the first group pixels is detected to be greater than or equal to the critical level, and the phase-difference detection signal of the second group pixels is detected to be less than the critical level, and determining that the current state is in the back focus state if, in the region of the image pickup device biased to the third direction from the optical axis, the phase-difference detection signal of the fifth group pixels is detected to be greater than or equal to the critical level, and the phase-difference detection signal of the sixth group pixels is detected to be less than the critical level.

The plurality of light-receiving sub-pixels may be of different colors, the auto-focusing method including: performing interpolation on the light receiving sub-pixels using neighboring pixels of the same pattern over the entire region of the image pickup device; and performing interpolation on the phase-difference detection sub-pixels using neighboring pixels of the same pattern over the entire region of the image pickup device.

The auto-focusing method may further include: extracting contrast information from the image pickup signal generated by a plurality of the light-receiving sub-pixels and determining whether the current state is in the in-focus state using the contrast information; and driving a lens according to a result of the in-focus state determination using the phase-difference detection signals, and a result of the in-focus state determination using the contrast information.

According to another aspect, there is provided a computer readable storage medium that stores computer program codes for executing an auto-focusing method of a digital photographing apparatus including an image pickup device, wherein the image pickup device includes a plurality of pixels arranged over an entire region of the image pickup device, each pixel including: a plurality of light-receiving sub-pixels that generate an image pickup signal from incident light; and a phase-difference detection sub-pixel having a confined light-receiving region and for generating and outputting the phase-difference detection signal; the plurality of pixels include first group pixels and second group pixels that each are classified according to an arrangement of the confined light-receiving region of the phase-difference detection sub-pixel thereof, and the confined light-receiving region of the phase-difference detection sub-pixel of the first group pixels and the confined light-receiving region of the phase-difference detection sub-pixel in the second group pixels are arranged biased to opposite directions, the auto-focusing method including: determining whether the current state is in an in-focus state by detecting the magnitudes of the phase-difference detection signals of the first group pixels and the second group pixels according to pixel regions of the image pickup device; and determining whether the current state is in a front focus state or in a back focus state if not in an in-focus state.

BRIEF DESCRIPTION OF THE DRAWINGS

The above and other features and advantages of the present invention will become more apparent by describing in detail exemplary embodiments thereof with reference to the attached drawings in which:

FIGS. 2A-C are side view illustrations of structures of phase difference detection sub-pixels and light receiving sub-pixels included in an image pickup device according to an embodiment of the present invention;

FIG. 3 is a perspective view illustrating a shooting pupil of the image pickup device of FIG. 2, according to an embodiment of the present invention;

FIG. 4 is a pictorial illustration showing arrangements of a plurality of sub-pixels in a plurality of pixels, according to embodiments of the present invention;

FIG. 5A is a pictorial illustration showing an arrangement of a plurality of pixels according to an embodiment of the present invention;

FIG. 6 is a block diagram illustrating a configuration of a CPU/DSP, and some elements of a photographing apparatus, according to an embodiment of the present invention;

FIGS. 7A to 7C are pictorial diagrams and graphs for describing a method of phase-difference auto-focusing (AF) in a phase-difference AF processing unit;

FIGS. 8A-8D are pictorial diagrams for explaining interpolation according to embodiments of the present invention;

DETAILED DESCRIPTION

Certain embodiments are described more fully with reference to the accompanying drawings, in which various inventive aspects and features are shown. In the following description, various features are described, and a detailed description of certain other features that are obvious to one of ordinary skill in the art are not provided to avoid obscuring the inventive subject matter. The specification and drawings are provided for illustrative purposes only and are not intended to limit the scope of the invention. Unless otherwise defined, terms used herein have the meaning as commonly understood by one of ordinary skill in the art to which this invention belongs. It will be further understood that terms should be interpreted as having a meaning that is consistent with their meaning in the context of the relevant art and will not be interpreted in an idealized or overly formal sense unless expressly so defined herein.

Figure 1:
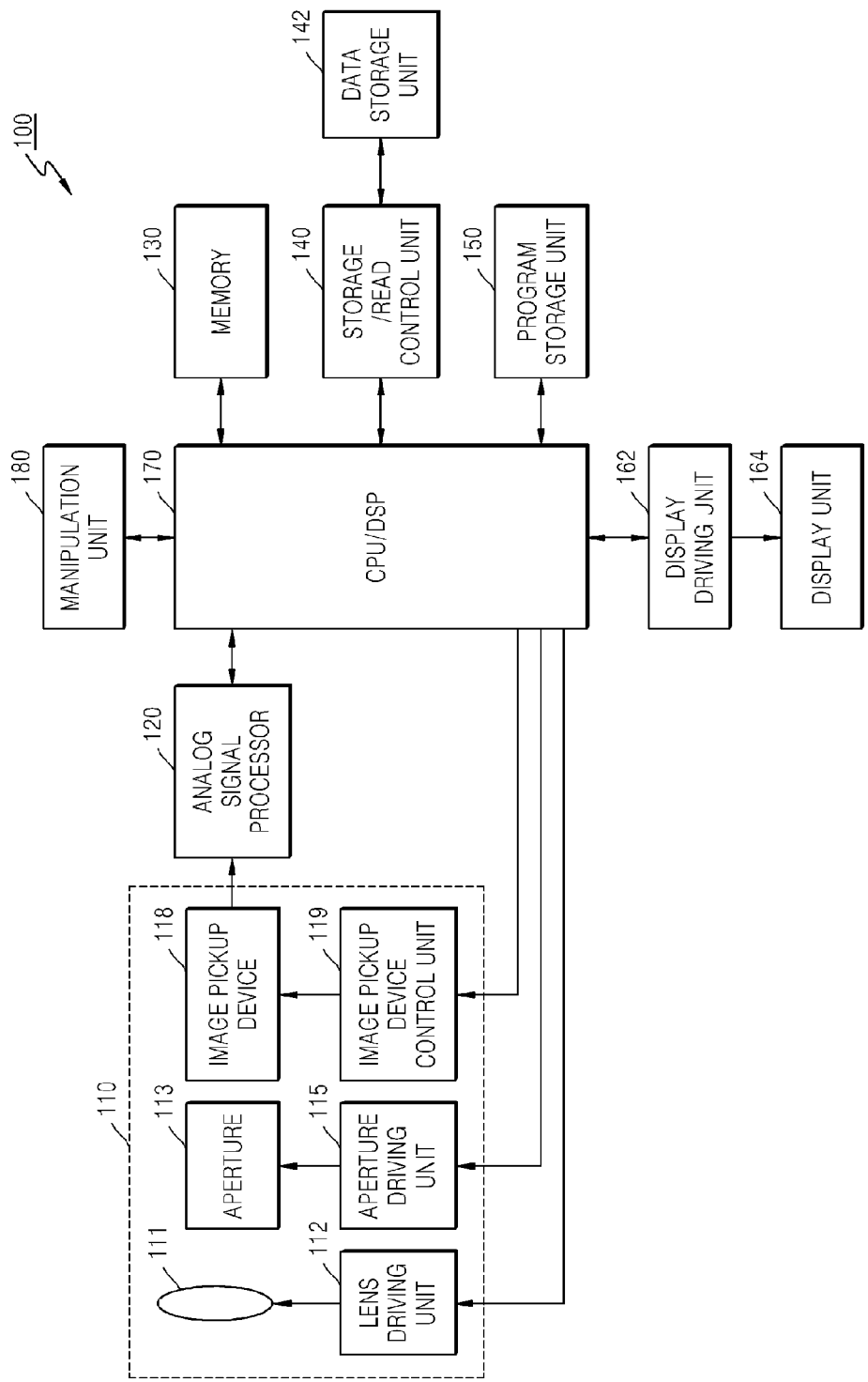
FIG. 1 is a block diagram of a digital photographing apparatus according to an exemplary embodiment of the present invention.

FIG. 1 is a block diagram of a digital photographing apparatus 100 according to an exemplary embodiment of the present invention.

According to the current embodiment, referring to FIG. 1, the digital photographing apparatus 100 includes a photographing unit 110, an analog signal processor 120, a memory 130, a storage/read controller 140, a data storage unit 142, a program storage unit 150, a display driving unit 162, a display unit 164, a central processing unit/digital signal processor (CPU/DSP) 170, and a manipulating unit 180.

The overall operation of the digital photographing apparatus 100 is controlled by the CPU/DSP 170. The CPU/DSP 170 provides a control signal for operating individual elements, such as a lens driving unit 112, an aperture driving unit 115, an image pickup device control unit 119, and the like.

The photographing unit 110, which is an element for generating an electric image signal from incident light, includes a lens 111, the lens driving unit 112, an aperture 113, the aperture driving unit 115, an image pickup device 118, and the image pickup device control unit 119.

The lens 111 may include a plurality of lenses. The position of the lens 111 is controlled by the lens driving unit 112. The lens driving unit 112 may control the position of the lens 111 according to a control signal from the CPU/DSP 170.

The aperture 113, whose degree of opening may be controlled by the aperture driving unit 115, may adjust an amount of light incident onto the image pickup device 118.

An optical signal having passed the lens 111 and the aperture 113 forms an image of a subject upon reaching a light receiving surface of the image pickup device 118. The image pickup device 118 may be a complementary metal oxide semiconductor image sensor (CIS) for converting an optical signal to an electric signal. A sensitivity of the image pickup device 118 may be controlled by the image pickup device control unit 119. The image pickup device control unit 119 may control the image pickup device 118 in real time according to a control signal automatically generated in response to an input image signal, or a control signal manually input by a user.

An exposure time (not shown) of the image pickup device 118 is controlled using a shutter (not shown). The shutter may be a mechanical shutter for adjusting light incidence by moving the aperture 113 or may be an electronic shutter for adjusting exposure by supplying an electric signal to the image pickup device 118.

The analog signal processor 120 may perform noise reduction processing, gain adjustment, waveform shaping, analog-to-digital conversion, or the like on an analog signal from the image pickup device 118.

A signal processed by the analog signal processor 120 may be input to the CPU/DSP 170 directly or via the memory 130. The memory 130 may serve as a main memory of the digital photographing device 100, and temporarily store information required during an operation of the CPU/DSP 170. The program storage unit 150 may store a program for operating the digital photographing apparatus 100, such as an operating system, an application system, and the like.

The digital photographing apparatus 100 may include the display unit 164 for displaying an operation status or image information captured by the digital photographing device 100. The display unit 164 may provide visual information and/or auditory information to the user. To provide visual information, the display unit 164 may include, for example, a liquid crystal display (LCD) panel, an organic light-emitting display (OLED) panel, or the like. The display unit 164 may be a touch screen able to sense an input when the screen is touched.

The display driving unit 162 may provide a driving signal to the display unit 164.

The CPU/DSP 170 may process an input image pickup signal, and may control each element of the digital photographing apparatus 100 according to the input image pickup signal or an external input signal. The CPU/DSP 170 may reduce noise of the input image pickup signal, and may perform image signal processing for image quality improvement, for example, gamma correction, color filter array interpolation, color matrix, color correction, and color enhancement. Compression may be performed on image data generated from the image signal processing for image quality improvement to generate an image file, from which the image data may also be restored. A compression format of the image data may be reversible or irreversible. Appropriate examples of the compression format for still images are a Joint Photographing Experts Group (JPEG) format, a JPEG 2000 format, and the like. For moving pictures, a plurality of frames may be compressed according to a Moving Picture Experts Group (MPEG) standard, to generate a moving picture file. The image file may be created according to an Exchangeable image file format (Exif) standard.

Image data output from the CPU/DSP 170 may be input to the storage/read controller 140 directly or via the memory 130. The storage/read controller 140 may store the image data in the data storage unit 142 automatically or according to a signal input from the user. The storage/read controller 140 may read data of an image from the image file stored in the data storage unit 142, and may provide the data to the display driving unit 162 via the memory 130 or another path to display the image on the display unit 164. The data storage unit 142 may be a separable component or a built-in component of the digital photographing apparatus 100.

The CPU/DSP 170 may also perform obscurity coloring, blurring, edge enhancing, image analysis processing, image recognition, image effect processing, and the like. The image recognition may be a face recognition process, a scene recognition process, or the like. The CPU/DSP 170 may perform a display image signal process for displaying on the display unit 164. For example, bright level adjustment, color correction, contrast adjustment, contour enhancing, screen dividing, creation, and synthesis of images, such as a character image, may be performed. The CPU/DSP 170 may perform a predetermined image signal process on image data to be displayed on an external monitor connected thereto, and transfer the processed image data to display a corresponding image on the external monitor.

The CPU/DSP 170 may execute a program stored in the memory 130, which is a program storage unit. The CPU/DSP 170 may include an extra module for generating a control signal for auto-focusing, zoom ratio changes, focus shifting, auto-exposure correction, and the like, to provide the control signal to the aperture driving unit 115, the lens driving unit 112, and the image pickup device control unit 119, and may control constituent elements of the digital photographing apparatus 100, such as the shutter, a flash, and the like.

The manipulation unit 180 is an element via which the user may input a control signal. The manipulation unit 180 may include a variety of functional buttons, for example, a shutter-release button for inputting a shutter-release signal for exposing the image pickup device 118 to light for a predetermined time to capture an image, a power button for inputting a control signal for controlling powering on or off, a zoom button for widening or narrowing an angle of view according to an input, a mode selection button, and other buttons for photographing set value adjustment. The manipulation unit 180 may be embodied in any form allowing a user to input a control signal, for example, as a button, a keyboard, a touch pad, a touch screen, a remote controller, or the like.

FIGS. 2A-2C illustrate structures of phase difference detection sub-pixels and light receiving sub-pixels included in the image pickup device 118, according to an embodiment of the present invention.

In the current embodiment of the present invention, the image pickup device 118 may include a plurality of pixels each including a plurality of sub-pixels. The plurality of sub-pixels constituting each pixel may include at least one phase-difference detection sub-pixel and a plurality of light-receiving sub-pixels.

Each sub-pixel includes a photodiode layer 210, a mask layer 220, and a microlens 230.

The photodiode layer 210 converts an optical signal L into an electric signal by photoelectric conversion. The intensity of the electric signal may vary according to the intensity of the optical signal L.

The mask layer 220 may define a light-receiving region of each sub-pixel. To this end, the mask layer 220 may include an aperture 212, 214 or 216 that corresponds to the light-receiving region of each sub-pixel. The mask layer 220 may be implemented as a metal mask.

The microlens 230 may focus the incident optical signal L and transfer the same to the photodiode layer 210.

The phase difference detection sub-pixel (S) may have a confined light-receiving region 212 and 214, which is biased to a direction. The phase-difference detection sub-pixel S may include a confined light-receiving region 212 and 214 that is biased to a direction opposite to that of an adjacent pixel. The plurality of pixels may be grouped according to arrangements of the confined light-receiving regions 212 and 214 of the phase-difference detection sub-pixels S.

According to the current embodiment of the present invention, as illustrated in FIGS. 2A and 2B, the plurality of pixels may include two kinds of phase-difference detection sub-pixels sl and sr. A pixel including a first phase-difference detection sub-pixel sl is referred to as a first group pixel, and a pixel including a second phase-difference detection sub-pixel sr is referred to as a second group pixel. A plurality of first phase-difference detection sub-pixels sl may each have a confined light-receiving region 212 biased to a first direction and the first phase-difference detection sub-pixels sl may be arranged in a row direction. A plurality of the second phase-difference detection sub-pixels sr may each have a confined light-receiving region 214 biased to a second direction opposite to the first direction and the second phase-difference detection sub-pixels sr may be arranged in the row direction.

The confined light-receiving regions 212 and 214 may form a shape extending along a column direction perpendicular to the row direction.

The plurality of light-receiving sub-pixels may include a combination of sub-pixels selected from, but not limited to, the group consisting of red sub-pixels, blue sub-pixels, green sub-pixels, and cyan sub-pixels. Each light-receiving sub-pixel is formed over the entire region of the corresponding sub-pixel with a light receiving region 216 disposed in a center of the light-receiving sub-pixel. The light-receiving region 216 of each light-receiving sub-pixel defines a sub-pixel and is surrounded by the mask layer 220 to avoid interference with adjacent sub-pixels.

FIG. 3 illustrates a shooting pupil of the image pickup device 118, according to an embodiment of the present invention.

According to the current embodiment of the present invention, the image pickup device 118 may include a combination of shooting pupils including a shooting pupil of a light-receiving sub-pixel defined in circular or oval form with a center point on an optical axis, a shooting pupil of a first phase-difference detection sub-pixel sl defined in circular or oval form, biased to a first direction with respect to the optical axis, and a shooting pupil of a second phase-difference detection sub-pixel sr defined in circular or oval form, biased to a second direction from the optical axis. According to the current embodiment of the present invention, a combination of these shooting pupils enables the image pickup device 118 to generate an image pickup signal according to incident light and at the same time to detect a phase difference for auto-focusing (AF).

FIGS. 4A-F illustrate arrangements of a plurality of sub-pixels in a plurality of pixels, according to embodiments of the present invention.

The plurality of pixels may have the same sub-pixel pattern over the entire region of the image pickup device 118. The plurality of sub-pixels may have various patterns as illustrated in FIGS. 4A-F. Referring to FIGS. 4A-F, R, G, and B denote red, green, and blue light-receiving sub-pixels, respectively, and S denotes a phase-difference detection sub-pixel. As illustrated in FIGS. 4A-F, the phase-difference detection sub-pixel S, and the light-receiving sub-pixels R, G, and B may be arranged in different manners. Although the description of the present application focuses on the embodiment where the plurality of pixels have the sub-pixel pattern of FIG. 4A, for convenience of explanation, the plurality of pixels may have various sub-pixel patterns.

Figure 5B:
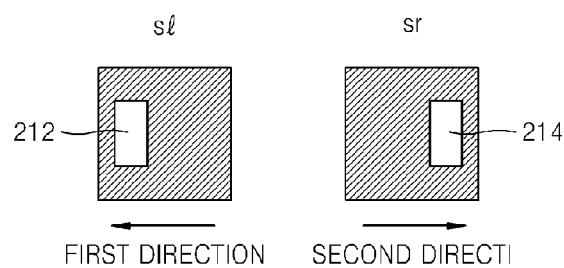
FIG. 5B is a pictorial illustration showing light-receiving regions of phase-difference detection sub-pixels.
Figure 5C:
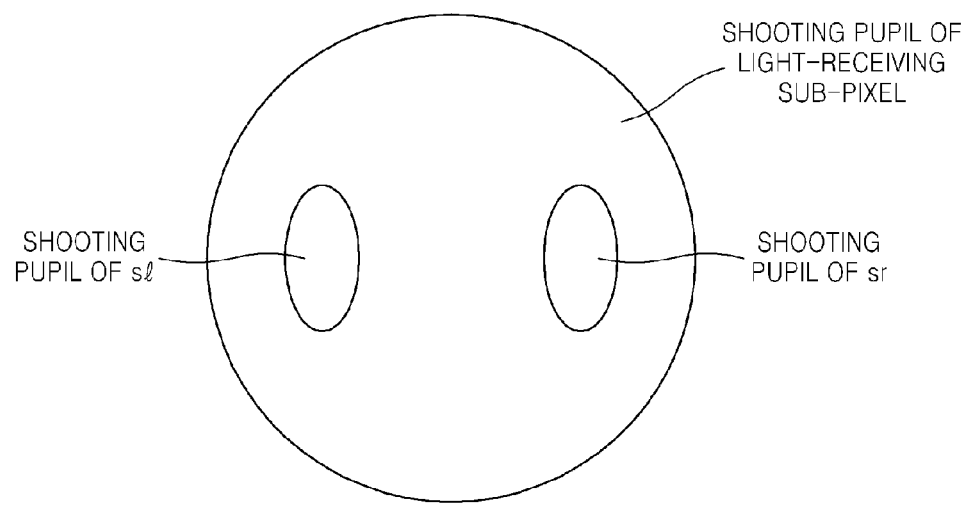
FIG. 5C is a pictorial illustration showing shooting pupils.

FIG. 5A illustrates an arrangement of a plurality of pixels according to an embodiment of the present invention. FIG. 5B illustrates light-receiving regions of phase-difference detection sub-pixels sl and sr. FIG. 5C illustrates shooting pupils.

In the current embodiment of the present invention, a plurality of pixels are arranged in the image pickup device 118, as illustrated in FIG. 5A, including phase-difference detection sub-pixels sr and sl and pluralities of light-receiving sub-pixels R, G, and B. Pixels including first phase-difference detection sub-pixels sl are referred to as first group pixels G1, and pixels including second phase-difference detection sub-pixels sr are referred to as second group pixels G2.

As illustrated in FIG. 5B, a first phase-difference detection sub-pixel sl may include a confined light-receiving region 212 arranged biased to a first direction. A second phase-difference detection sub-pixel sr may include a confined light-receiving region 214 arranged biased to a second direction. The confined light-receiving regions 212 and 214 of the first and second phase-difference detection sub-pixels sl and sr may form a shape extending along a column direction. As illustrated in FIG. 5A, pluralities of the first group pixels G1 and the second group pixels G2 may each be consecutively arranged in a row direction as a group, and the groups of the first group pixels G1 and the second group pixels G2 may alternate in the column direction.

According to an embodiment of the present invention, the confined light-receiving regions 212 and 214 may form shooting pupils, as illustrated in FIG. 5C, in the image pickup device 118. According to an embodiment of the present invention, an image pickup signal may be generated from an optical signal incident through a shooting pupil of a light-receiving sub-pixel, and phase-difference AF may be performed using optical signals incident through the shooting pupils of the first and second phase-difference detection sub-pixels sl and sr.

FIG. 6 is a block diagram illustrating a configuration of a CPU/DSP 170a, and some elements of the photographing apparatus 100, according to an embodiment of the present invention.

Referring to FIG. 6, the CPU/DSP 170a may include an AF signal extraction unit 610, an image pickup signal processing unit 620, a phase-difference AF processing unit 630, a contrast AF processing unit 640, an AF microcomputer 650, an interpolation unit 660, and a codec 670. The image pickup device 118 may have a pixel arrangement as illustrated in FIG. 5A.

The AF signal extraction unit 610 may extract phase-difference detection signals from phase-difference detection sub-pixels sl and sr of the image pickup device 118. The AF signal extraction unit 610 may extract a first phase-difference detection signal from a first phase-difference detection sub-pixel sl and a second phase-difference detection signal from a second phase-difference detection sub-pixel sr from each of the pixels. The intensity of the first phase-difference signal and the second phase-difference signal may be detected according to the location of a pixel in row direction. In an embodiment of the present invention, if a signal to noise ratio of the first phase-difference detection signal or the second phase-difference detection signal of pixels is low, the first phase-difference detection signals of first phase-difference detection sub-pixels sl or the second phase-difference detection signals of second phase-difference detection sub-pixels sr may be integrated over rows.

The image pickup signal processing unit 620 may extract an image pickup signal output from light-receiving sub-pixels R, G, and B of the image pickup device 118, and process the image pickup signal. The image pickup signal processing unit 620 may receive the image pickup signal output from the image pickup device 118 and processed in the analog signal processing unit 120 by, for example, noise elimination, signal amplitude adjustment, analog-to-digital conversion, and the like, to process the image pickup signal by, for example, interpolation, white balancing, gamma processing, edge enhancing, noise elimination, and the like. The image pickup signal processing unit 620 may perform color coordinate conversion on an RGB signal output from the image pickup device 630. For example, the image pickup signal processing unit 620 may convert an RGB signal to a YCC signal. The image pickup signal processing unit 620 may include the interpolation unit 660 for an interpolation process.

The phase-difference AF processing unit 630 may perform phase-difference AF on the first and second phase-difference detection signals.

FIGS. 7A-1 to 7C-3 are diagrams for describing a method of phase-difference AF in the phase-difference AF processing unit 630. FIGS. 7A-1-7A-3 illustrate an in-focus state, FIGS. 7B-1-7B-3 illustrate a front focus state, and FIG. 7C-1-7C-3 illustrate a back focus state. In FIGS. 7A-1 to 7C-3, a pixel location is defined along a row direction.

In the in-focus state, as illustrated in FIG. 7A-1, an optical signal incident onto the image pickup device 118 through the lens 111 is focused on a center region of a light-receiving surface of the image pickup device 118. In the in-focus state, as illustrated in FIG. 7A-2, first phase-difference detection sub-pixels sl and second phase-difference detection sub-pixels sr in the center region of the light receiving surface may both receive light, and a valid phase-difference detection signal may be detected in the center region. Thus, if the magnitudes of the first and second phase-difference detection signals in the center region of the image pickup device 118 are detected as being greater than or equal to a predetermined critical level, the phase-difference AF processing unit 630 may determine that a current state is the in-focus state.

In the front focus state, as illustrated in FIG. 7B-1, an optical signal incident onto the image pickup device 118 through the lens 111 is not focused on the center region of the light-receiving surface of the image pickup device 118, and is instead focused in front of the light-receiving surface of the image pickup device 118.

In the front focus state, as illustrated in FIG. 7B-2, an optical signal to be incident onto a first direction region AL of the image pickup device 118, which is located off an optical axis toward a first direction, may be blocked by a mask layer of a first phase-difference detection sub-pixel sl, thus being unable to reach a photodiode in the first phase-difference detection sub-pixel sl, but may be incident onto a photodiode only in a second phase-difference detection sub-pixel sr. In contrast, an optical signal to be incident onto a second direction region AR of the image pickup device 118, which is located off the optical axis toward a second direction, may be incident onto a photodiode of a first phase-difference detection sub-pixel sl, but may not reach a photodiode of a second phase-difference detection sub-pixel sr.

Thus, as illustrated in FIG. 7B-3, in the front focus state, in the first direction region AL, which is located off the optical axis toward the first direction, the second phase-difference detection signal may have a high magnitude (I), while the first phase-difference detection signal may have a low magnitude (I). In the second direction region AR, which is located off the optical axis toward the second direction, the first phase-difference detection signal may have a high magnitude (I), while the second phase-difference detection signal may have a low magnitude (I). If the second phase-difference detection signal of the first direction region AL of the image pickup device 118, which is located off the optical axis toward the first direction, is detected having a magnitude (I) greater than or equal to a predetermined critical level, the first phase-difference detection signal of the first direction region AL is detected having a magnitude (I) less than the predetermined critical level, the first phase-difference detection signal in the second direction region AR of the image pickup device 118, which is located off the optical axis toward the second direction, is detected having a magnitude (I) greater than or equal to the predetermined critical level, and the second phase-difference detection signal in the second direction region is detected having a magnitude (I) less than the predetermined critical level, the phase-difference AF processing unit 630 may determine that a current state is the front focus state.

In the back focus state, as illustrated in FIG. 7C-1, an optical signal incident onto the image pickup device 118 through the lens 111 is not focused on the center region of the light-receiving surface of the image pickup device 118, and is instead focused behind the light-receiving surface of the image pickup device 118.

In the back focus state, as illustrated in FIG. 7C-2, an optical signal to be incident onto the first direction region AL of the image pickup device 118, which is located off the optical axis toward a first direction, may be blocked by a mask layer of a second phase-difference detection sub-pixel sr, thus being unable to reach a photodiode of the second phase-difference detection sub-pixel sr, but may be incident onto a photodiode only in a first phase-difference detection sub-pixel sl. In contrast, an optical signal to be incident onto the second direction region AR of the image pickup device 118, which is located off the optical axis toward a second direction, may be incident onto a photodiode of a second phase-difference detection sub-pixel sr, but may not reach a photodiode of a first phase-difference detection sub-pixel sl.

Thus, as illustrated in FIG. 7C-3, in the back focus state, in the first direction region AL, which is located off the optical axis toward the first direction, the first phase-difference detection signal may have a high magnitude (I), while the second phase-difference detection signal may have a low magnitude (I). In the second direction region AR, which is located off the optical axis toward the second direction, the second phase-difference detection signal may have a high magnitude (I), while the first phase-difference detection signal may have a low magnitude (I). If the first phase-difference detection signal of the first direction region AL of the image pickup device 118, which is located off the optical axis toward the first direction, is detected to having a magnitude (I) greater than or equal to a predetermined critical level, the second phase-difference detection signal of the first direction region AL is detected having a magnitude (I) less than the predetermined critical level, the second phase-difference detection signal in the second direction region AR of the image pickup device 118, which is located off the optical axis toward the second direction, is detected to having a magnitude (I) greater than or equal to the predetermined critical level, and the first phase-difference detection signal in the second direction region is detected having a magnitude (I) less than the predetermined critical level, the phase-difference AF processing unit 630 may determine that a current state is the back focus state.

In an embodiment of the present invention, to determine whether a current state is in the in-focus state, the phase-difference AF processing unit 630 may calculate a correlation value between the first and second phase-difference detection signals. For example, correlation values between the first phase-difference detection signals and the second phase-difference detection signals of each of the pixels may be calculated. If a correlation value in the center region of the image pickup device 118 is greater than or equal to a threshold value, the center region of the image pickup device 118 is determined to be in the in-focus state. Otherwise, the center region of the image pickup device 118 may be determined to be an AF disable state.

The contrast AF processing unit 640 may perform contrast-based AF using an image pickup signal processed by the image pickup signal processing unit 620. The contrast AF processing unit 640 may extract a high-frequency component of the image pickup signal corresponding to a contrast component using a band path filter. A predetermined process, for example, an integration process, may be performed on the extracted contrast component. For example, an integration of the contrast component may be performed with respect to time. The contrast AF processing unit 640 may drive the lens 111 to maximize the contrast component.

In an embodiment of the present invention, the contrast AF processing unit 640 may perform contrast AF using a Y component, i.e., a luminance component, of an image pickup signal converted to a YCC signal.

The AF microcomputer 650 may generate a lens driving control signal using a result value of phase-difference AF by the phase-difference AF processing unit 630 and a result value of contrast AF by the contrast AF processing unit 640, and may output the lens driving control signal to the lens driving unit 112. According to embodiments of the present invention, since whether a current state is the in-focus state and a driving direction of the lens may be determined by the phase-difference AF processing unit 630, it may be not necessary to detect contrast components with respect to the entire driving range of the lens 111, and contrast AF may be performed using only contrast components detected from some regions. This contrast-based AF may be performed by the AF microcomputer 650. Therefore, high-speed, precise AF may be performed according to the above-described embodiments of the present invention.

Although FIG. 6 illustrates an embodiment of the present invention in which both phase-difference AF and contrast AF are performed, the present invention is not limited thereto. In another embodiment of the present invention, AF may be performed using only a result of phase-difference AF by the phase-difference AF processing unit 630.

The interpolation unit 660 interpolates an image pickup signal generated by the image pickup device 118.

FIG. 8 is a diagram for explaining interpolation according to embodiments of the present invention.

In current embodiments of the present invention, the image pickup device 118 may have the same sub-pixel pattern over its entire region. That is, each pixel of the image pickup device 118 may include a phase-difference detection sub-pixel S in the same location. This structure enables interpolation of the entire region of the image pickup device 118 using neighboring pixels of the same pattern. Therefore, according to the current embodiments, uniform interpolation may be guaranteed with the image pickup device 118 including the phase-difference detection pixels S.

Figures 8A, 8B, 8C, 8D:
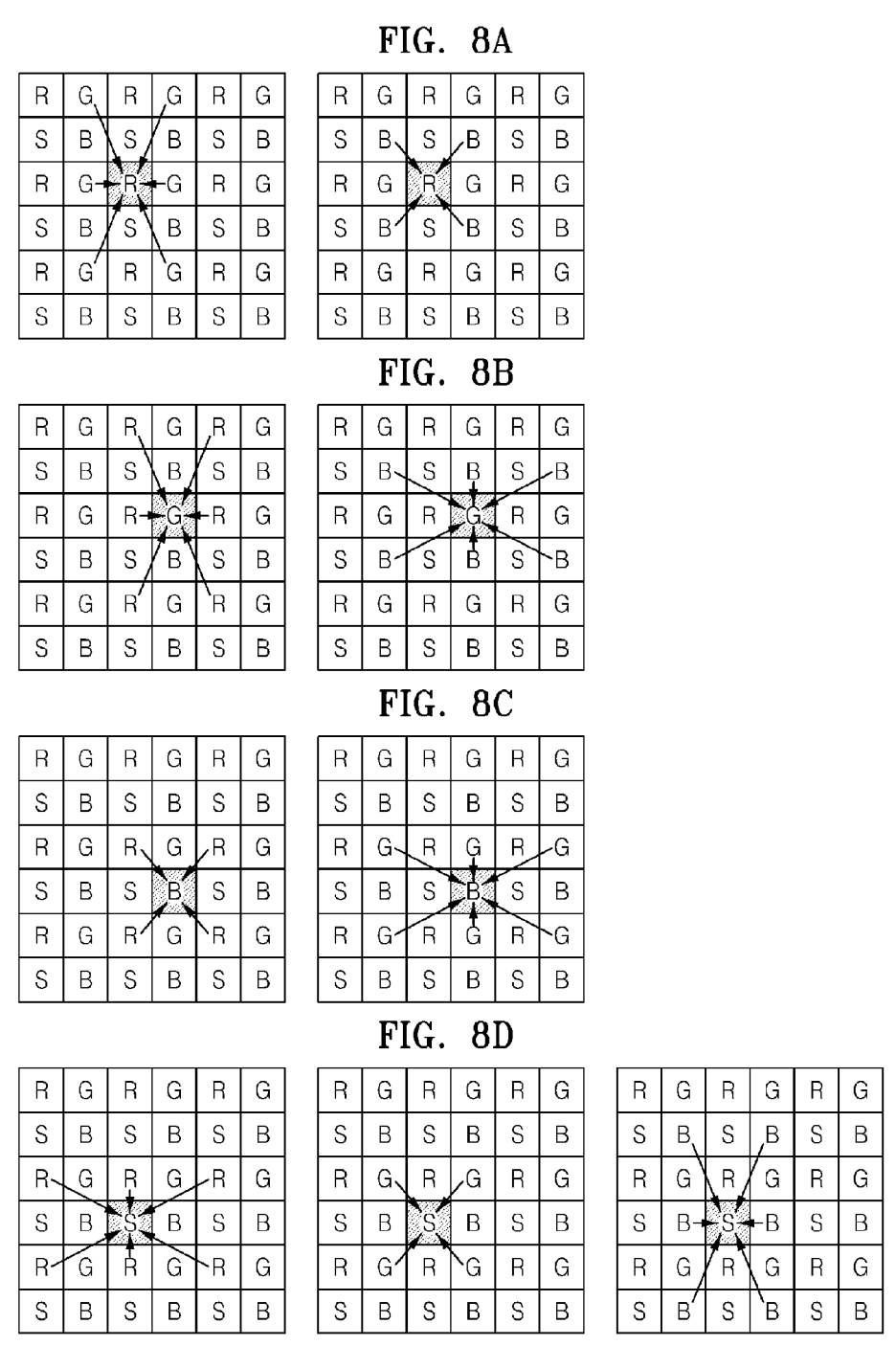

FIG. 8A illustrates an example of interpolation of a red sub-pixel R. The interpolation unit 660 acquires a green component using image pickup signals of neighbor green sub-pixels G neighboring the red sub-pixel R, and a blue component using image pickup signals of blue sub-pixels B neighboring the red sub-pixel R.

FIG. 8B illustrates an example of interpolation of a green sub-pixel G. The interpolation unit 660 acquires a red component using image pickup signals of red sub-pixels R neighboring the green sub-pixel G, and a blue component using image pickup signals of blue sub-pixels B neighboring the green sub-pixel G.

FIG. 8C illustrates an example of interpolation of a blue sub-pixel B. The interpolation unit 660 acquires a red component using image pickup signals of red sub-pixels R neighboring the blue sub-pixel B, and a green component using image pickup signals of green sub-pixels G neighbor the blue sub-pixel B.

FIG. 8D illustrates an example of interpolation of a phase-difference detection sub-pixel S. The interpolation unit 660 acquires a red component using image pickup signals of red sub-pixels R neighboring the phase-difference detection sub-pixel S, a green component using image pickup signals of green sub-pixels G neighboring the phase-difference detection sub-pixel S, and a blue component from image pickup signals of blue sub-pixel B neighboring the phase-difference detection sub-pixel S.

As illustrated in FIGS. 8A-8D, individual red sub-pixels R, green sub-pixels G, blue sub-pixels B, and phase-difference detection sub-pixels S may be uniformly interpolated using neighboring sub-pixels of the same pattern.

Referring back to FIG. 6, the codec 670 may encode an image pickup signal processed by the image pickup signal processing unit 620, according to a predetermined format, or may decode an image file stored in, for example, the data storage unit 142 after being encoded. The codec 670 may encode the image pickup signal according to a JPEG standard, an MPEG standard, or the like, or may decode an image signal in the image file.

Figure 9:
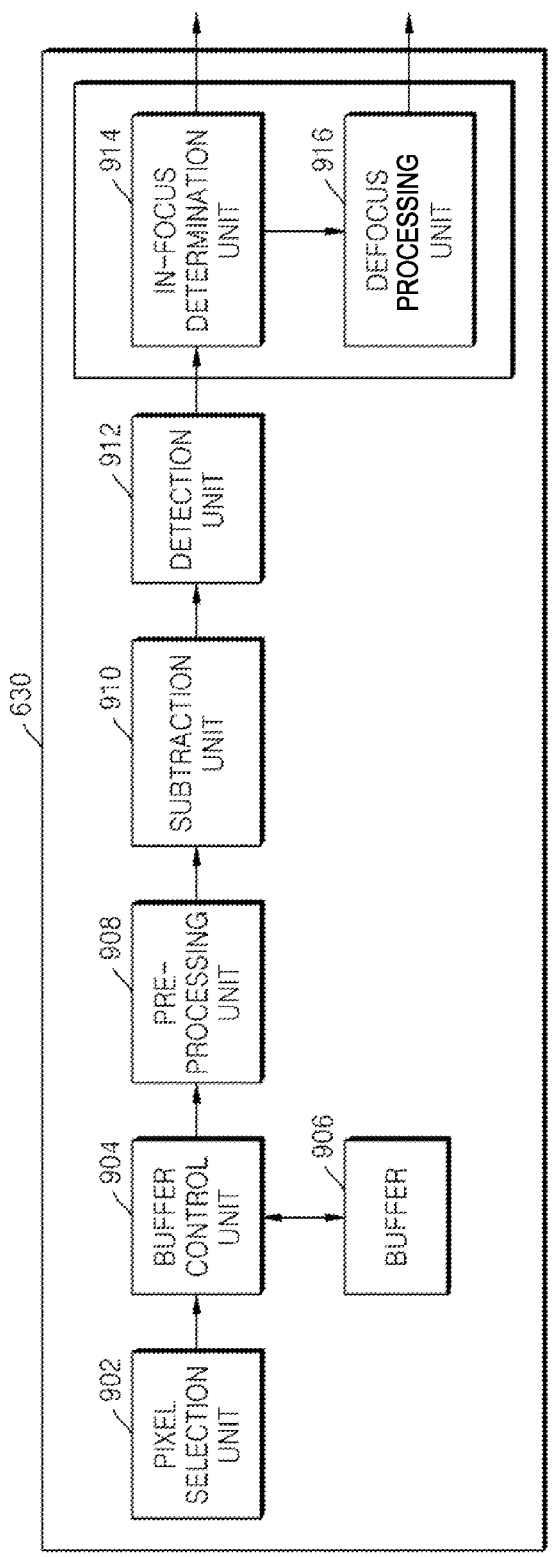
FIG. 9 is a block diagram illustrating a configuration of a phase-difference AF processing unit according to an embodiment of the present invention.

FIG. 9 is a block diagram illustrating a configuration of the phase-difference AF processing unit 630, according to an embodiment of the present invention.

According to the current embodiment of the present invention, the phase-difference AF processing unit 630 may include a pixel selection unit 902, a buffer control unit 904, a buffer 906, a pre-processing unit 908, a subtraction unit 910, a detection unit 912, an in-focus determination unit 914, and a defocus processing unit 916.

The pixel selection unit 902 receives a phase-difference detection signal extracted by the AF signal extraction unit 610 as the first and second phase-difference detection signal from each pixel, and stores the first and second phase-difference detection signals in the buffer 906 via the buffer control unit 904. The buffer control unit 904 corrects a time gap between the first and second phase-difference detection signals caused from a difference in location between imaging surfaces of first and second phase-difference detection sub-pixels sl and sr. The pre-processing unit 908 may process the first and second phase-difference detection signals, for example, to eliminate noise, to adjust a signal amplitude, and so that phase-difference information is readily detectable at a later process. The subtraction unit 910 performs subtraction between the first and second phase-difference detection signals to extract a difference between the first and second phase-difference detection signals. The detection unit 912 quantitatively detects information of the difference between the first and second phase-difference detection signals and calculates a correlation level between the first and second phase-difference detection signals. If the correlation level of the first and second phase-difference detection signals from the center region of the image pickup device 118, calculated by the detection unit 912, is high, or if both the magnitudes of the first and second phase-difference detection signals from the center region of the image pickup device 118 are greater than or equal to a critical level, the in-focus determination unit 914 may determine that a current state is the in-focus state. If the in-focus determination unit 914 determines that a current state is not the in-focus state, the defocus processing unit 916 may determine whether the current state is the front focus state or the back focus state. Whether in the current state is the front focus state or the back focus state may be determined as described with reference to FIGS. 7B-1-7C-3.

Figure 10:
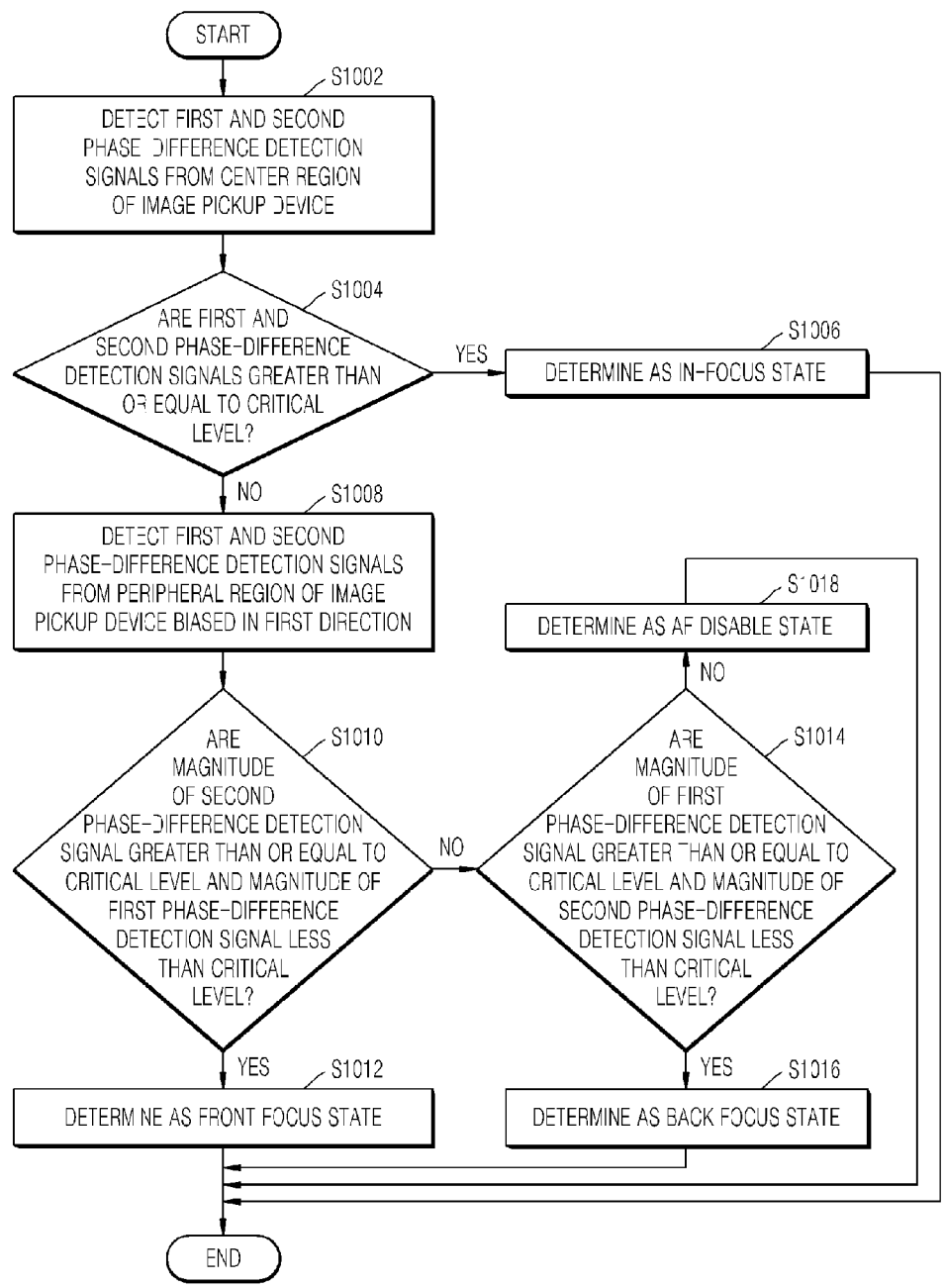
FIG. 10 is a flowchart illustrating an AF method according to an embodiment of the present invention.

FIG. 10 is a flowchart illustrating an AF method according to an embodiment of the present invention.

According to the current embodiment of the present invention, the AF method may involve detecting the first and second phase-difference detection signals from a center region of the image pickup device 118 (S1002), determining whether the magnitudes of the first and second phase-difference detection signals are greater than or equal to a critical level (S1004), and determining that a current state is the in-focus state (S1006). If either the magnitude of the first or second phase-difference detection signal is less than the critical level (S1004), the first and second phase-difference detection signals from a peripheral region of the image pickup device 118 toward a first direction from an optical axis are detected (S1008). If the magnitude of the second phase-difference detection signal is greater than or equal to the critical level and the magnitude of the first phase-difference detection signal is less than the critical level (S1010), the current state is determined as the front focus state (S1012). If the magnitude of the first phase-difference detection signal is greater than or equal to the critical level and the magnitude of the second phase-difference detection signal is less than the critical level (S1014), the current state is determined as the back focus state (S1016). If the current state is neither the front focus state nor the back focus state, the current state is determined as the AF disable state (S1018).

Figure 11A:
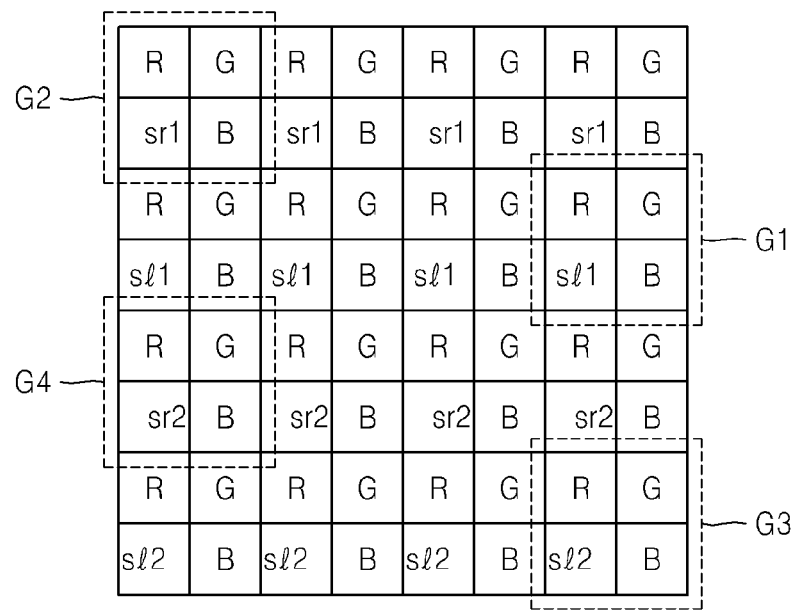
FIG. 11A is a pictorial diagram illustrating an arrangement of a plurality of pixels according to another embodiment of the present invention.
Figure 11B:
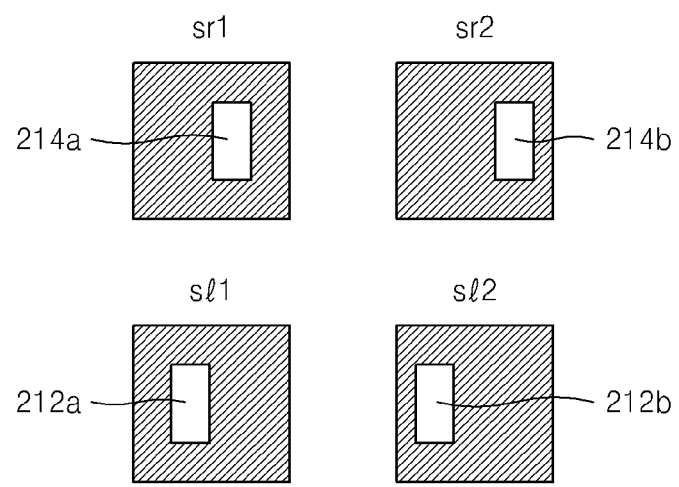
FIG. 11B is a pictorial diagram illustrating light-receiving regions of phase-difference detection sub-pixels.
Figure 11C:
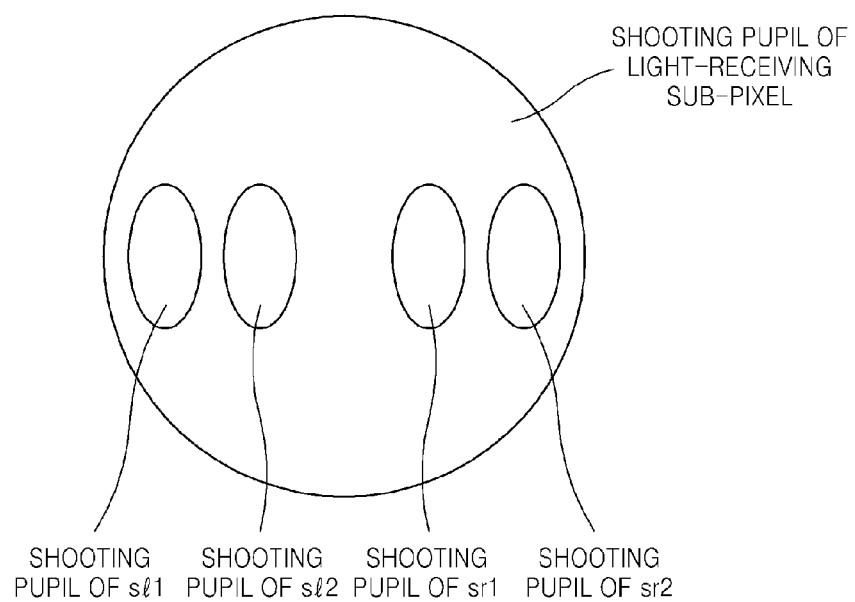
FIG. 11C is a pictorial diagram illustrating shooting pupils.
Figure 11D:
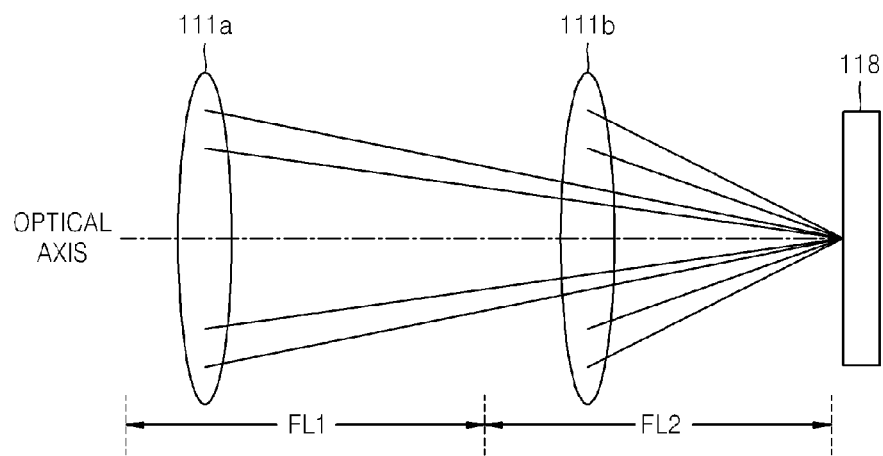
FIG. 11D is a side-view diagram for describing phase-difference AF operations according to focal distances.

FIG. 11A illustrates an arrangement of a plurality of pixels according to another embodiment of the present invention. FIG. 11B illustrates light-receiving regions of phase-difference detection sub-pixels sl1, sl2, sr1, and sr2. FIG. 11C illustrates shooting pupils, and FIG. 11D is a diagram for describing phase-difference AF operations according to focal distances.

According to the current embodiment of the present invention, as illustrated in FIG. 11A, a plurality of pixels are arranged in the image pickup device 118, each pixel including one of first to fourth phase-difference detection sub-pixels sl1, sl2, sr1, and sr2, and a plurality of light-receiving sub-pixels R, G, and B. Pixels including first phase-difference detection sub-pixels sl1 are referred to as first group pixels G1, pixels including second phase-difference detection sub-pixels sr1 are referred to as second group pixels G2, pixels including third phase-difference detection sub-pixels sl2 are referred to as third group pixels G3, and pixels including fourth phase-difference detection sub-pixels sr2 are referred to as fourth group pixels G4.

As illustrated in FIG. 11B, a first phase-difference detection sub-pixel sl1 may include a confined light-receiving region 212a arranged biased to a first direction. A second phase-difference detection sub-pixel sr1 may include a confined light-receiving region 214a arranged biased to a second direction. A third phase-difference detection sub-pixel sl2 may include a confined light-receiving region 212b arranged biased to the first direction. A fourth phase-difference detection sub-pixel sr2 may include a confined light-receiving region 214b arranged biased to the second direction. The confined light-receiving regions 212a, 214a, 212b, and 214b respectively of the first to fourth phase-difference detection sub-pixels sl1, sr1, sl2, and sr2 may form a shape extending along a column direction. As illustrated in FIG. 11A, pluralities of the first group pixels G1, the second group pixels G2, the third group pixels G3, and the fourth group pixels G4 may each be consecutively arranged in the row direction as a group, and the groups of the first group pixels G1, the second group pixels G2, the third group pixels G3, and the fourth group pixels G4 may alternate in the column direction.

According to an embodiment of the present invention, the confined light-receiving regions 212a, 214a, 212b, and 214b may form shooting pupils, as illustrated in FIG. 11C, in the image pickup device 118. According to an embodiment of the present invention, an image pickup signal may be generated from an optical signal incident through a shooting pupil of a light-receiving sub-pixel, and phase-difference AF may be performed with optical signals incident through the shooting pupils of the first to fourth phase-difference detection sub-pixels sl1, sr1, sl2, and sr2.

According to an embodiment of the present invention, referring to FIG. 11D, in a first focal distance region FL1, phase-difference AF may be performed using the first phase-difference detection signal from a first phase-difference detection sub-pixel sl1 and the second phase-difference detection signal from a second phase-difference detection sub-pixel sr1, and in a second focal distance region FL2, phase-difference AF may be performed using a third phase-difference detection signal from a third phase-difference detection sub-pixel sl2 and a fourth phase-difference detection signal from a fourth phase-difference detection sub-pixel sr2. The second focal distance region FL2 is a region in which shorter focal distances than those in the first focal distance region FL1 are defined.

In the first focal distance region FL1 where an optic angle is relatively small, the magnitudes of the third and fourth phase-difference detection signals output from respective third and fourth phase-difference detection sub-pixels sl2 and sr2 with the confined light-receiving regions each biased relatively much to the first or second direction may be too small to be used for phase-difference AF, while the magnitudes of the first and second phase-difference detection signals output from respective first and second phase-difference detection sub-pixels sl1 and sr1 with the confined light-receiving regions each biased relatively little to the first or second direction may be greater than or equal to a predetermined level that is high enough for phase-difference AF. In contrast, in the second focal distance region FL2 where an optic angle is large, the magnitudes of the first and second phase-difference detection signals output from respective first and second phase-difference detection sub-pixels sl1 and sr1 with the confined light-receiving regions each biased relatively little to the first or second direction may be too small to be used for phase-difference AF, while the magnitudes of the third and fourth phase-difference detection signals output from respective third and fourth phase-difference detection sub-pixels sl2 and sr2 with the confined light-receiving regions each biased relatively much to the first or second direction may be greater than or equal to the predetermined level that is high enough for phase-difference AF.

According to an embodiment of the present invention, in the first focal distance region FL1, phase-difference AF may be performed using the first and second phase-difference detection signals, and in the second focal distance region FL2, phase-difference AF may be performed using the third and fourth phase-difference detection signals. The foregoing structure may ensure high-performance phase-difference AF in all focal distance ranges within the driving range of the lens 111. The first focal distance region FL1 and the second focal distance region FL2 may be defined to be consecutive regions with respect to a predetermined threshold, or to overlap in a predetermined focal distance region.

Figure 12A:
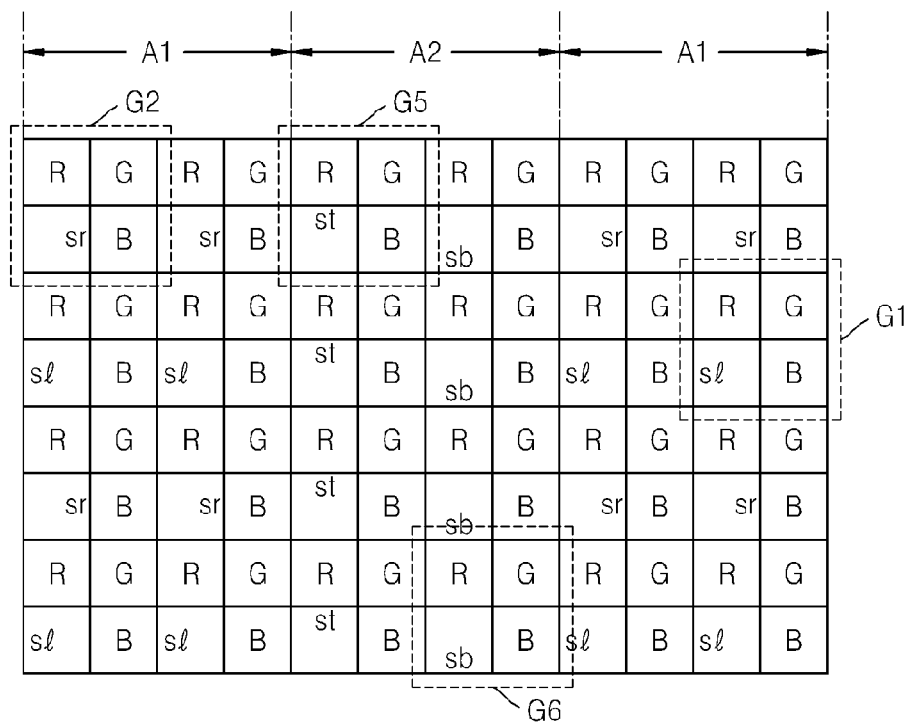
FIG. 12A is a pictorial diagram illustrating an arrangement of a plurality of pixels according to another embodiment of the present invention.
Figure 12B:
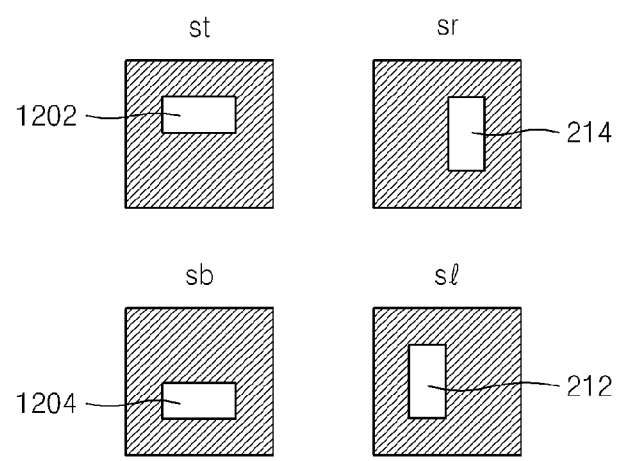
FIG. 12B is a pictorial diagram illustrating light-receiving regions of phase-difference detection sub-pixels.
Figure 12C:
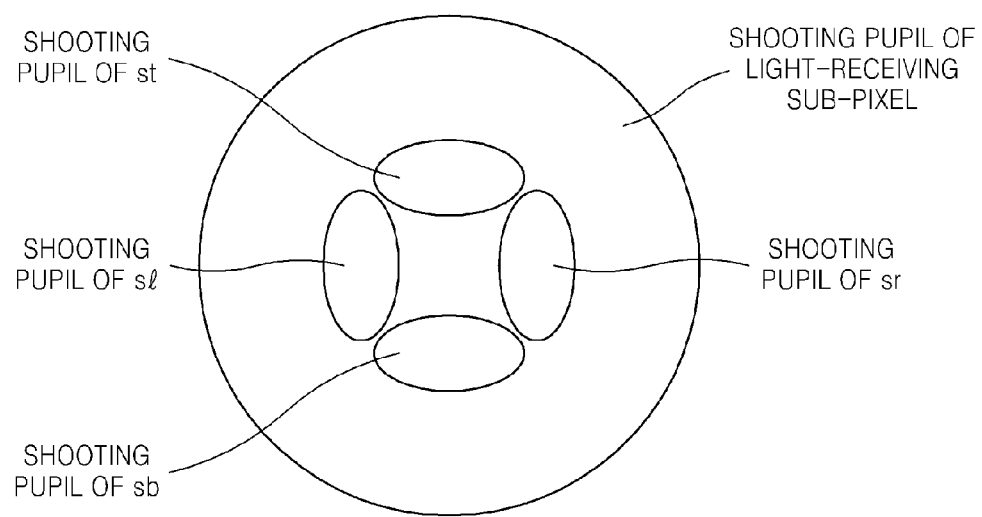
FIG. 12C is a pictorial diagram illustrating shooting pupils.

FIG. 12A illustrates an arrangement of a plurality of pixels according to another embodiment of the present invention. FIG. 12B illustrates light-receiving regions of phase-difference detection sub-pixels sl, sl, st, and sb. FIG. 12C illustrates shooting pupils.

According to the current embodiment of the present invention, as illustrated in FIG. 12A, a plurality of pixels are arranged in the image pickup device 118, each pixel including one of first, second, fifth, and sixth phase-difference detection sub-pixels sl, sr, st, and sb, and a plurality of light-receiving sub-pixels R, G, and B. Pixels including first phase-difference detection sub-pixels sl are referred to as first group pixels G1, pixels including second phase-difference detection sub-pixels sr are referred to as second group pixels G2, pixels including fifth phase-difference detection sub-pixels st are referred to as fifth group pixels G5, and pixels including sixth phase-difference detection sub-pixels sb are referred to as sixth group pixels G6.

As illustrated in FIG. 12B, a first phase-difference detection sub-pixel sl may include a confined light-receiving region 212 arranged biased to a first direction. A second phase-difference detection sub-pixel sr may include a confined light-receiving region 214 arranged biased to a second direction. A fifth phase-difference detection sub-pixel st may include a confined light-receiving region 1202 arranged biased to a third direction that is parallel to a column direction perpendicular to a row direction. A sixth phase-difference detection sub-pixel sb may include a confined light-receiving region 1204 arranged biased to a fourth direction that is parallel to the column direction and opposite to the third direction. The confined light-receiving regions 212 and 214 of the first and second phase-difference detection sub-pixels sl and sr may form a shape extending along the column direction. The confined light-receiving regions 1202 and 1204 of the fifth and sixth phase-difference detection sub-pixels st and sb may form a shape extending along the column direction.

As illustrated in FIG. 12A, the first group pixels G1 and the second group pixels G2 may be arranged in a first region A1, and the fifth group pixels G5 and the second group pixels G6 may be arranged in a second region A2. The first region A1 and the second region A2 may alternate, as illustrated in FIG. 12A.

In the first region A1, pluralities of the first group pixels G1 and the second group pixels G2 may each be consecutively arranged in a row direction as a group, and the groups of the first group pixels G1 and the second group pixels G2 may alternate in the column direction. In the second region A1, pluralities of the fifth group pixels G5 and the sixth group pixels G6 may each be consecutively arranged in the column direction, and the groups the fifth group pixels G5 and the sixth group pixels G6 may alternate in the row direction.

The arrangements of the first region A1 and the second region A2 are not limited to the embodiment of FIG. 12A, and may be varied in different ways. Widths of the first region A1 and the second region A2 may be larger than those illustrated in FIG. 12A. In another embodiment of the present invention, the first region A1 and the second region A2 may alternate, wherein each region includes a plurality of pixels in four columns. In another embodiment of the present invention, the first region A1 and the second region A2 may be arranged in a checkerboard pattern.

According to an embodiment of the present invention, the confined light-receiving regions 212, 214, 1202, and 1204 may form shooting pupils, as illustrated in FIG. 12C, in the image pickup device 118. According to an embodiment of the present invention, an image pickup signal may be generated from an optical signal incident through a shooting pupil of a light-receiving sub-pixel, and phase-difference AF may be performed using optical signals incident through the shooting pupils of the first, second, fifth, and sixth phase-difference detection sub-pixels sl, sr, st, and sb.

If, in a region of the image pickup device 118 located biased to the third direction away from an optical axis, a sixth phase-difference signal output from a sixth phase-difference detection sub-pixel sb is detected to be greater than or equal to a predetermined critical level and a fifth phase-difference detection signal output from a fifth phase-difference detection sub-pixel st is detected to be less than the predetermined critical level, a current state may be determined to be in the front focus state. If, in the region of the image pickup device 118 located biased to the third direction away from the optical axis, the fifth phase-difference detection signal is detected to be greater than or equal to the predetermined critical level and the sixth phase-difference detection signal is detected to be less than the predetermined critical level, the current state may be determined to be in a back focus state.

In the current embodiment in which a combination of shooting pupils of first and second phase-difference detection sub-pixels sl and sr biased along a row direction and shooting pupils of the fifth and sixth phase-difference detection sub-pixels st and sb biased along a column direction, high-performance phase-difference AF may be secured even when no phase difference characteristic in either the row or column direction is detected from incident optical signals.

Figure 13A:
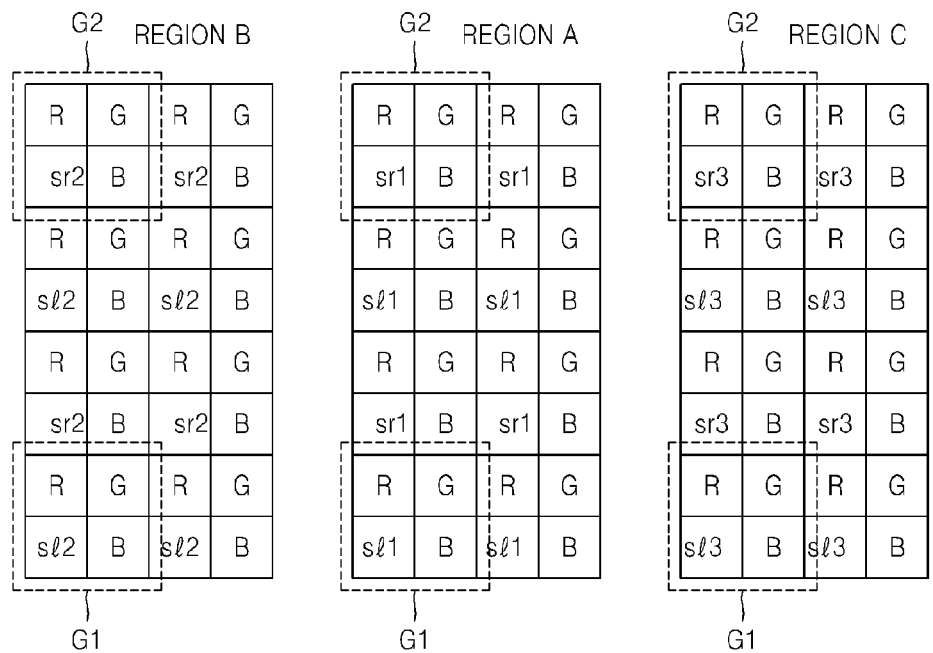
FIG. 13A is a pictorial diagram illustrating an arrangement of a plurality of pixels according to another embodiment of the present invention.
Figure 13B:
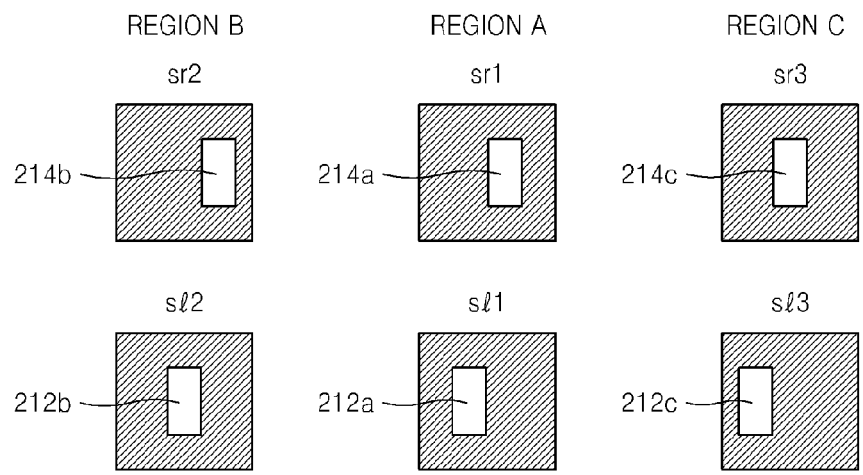
FIG. 13B is a pictorial diagram illustrating light-receiving regions of phase-difference detection sub-pixels.
Figure 13C:
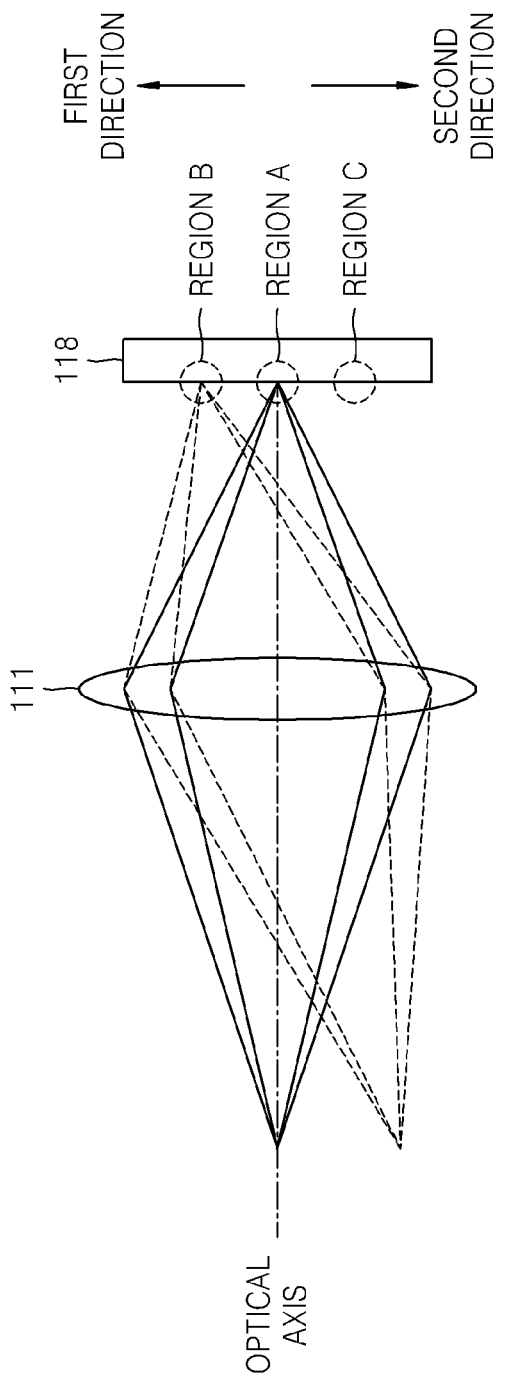
FIG. 13C is a side view diagram for describing arrangements of the phase-difference detection sub-pixels according to regions of the image pickup device 118.

FIG. 13A illustrates an arrangement of a plurality of pixels according to an embodiment of the present invention. FIG. 13B illustrates light-receiving regions of phase-difference detection sub-pixels sl1, sr1, sl2, sr2, sl3, and sr3. FIG. 13C is a diagram for describing arrangements of the phase-difference detection sub-pixels sl1, sr1, sl2, sr2, sl3, and sr3 according to regions of the image pickup device 118.

According to the current embodiment of the present invention, as illustrated in FIG. 13A, a plurality of pixels are arranged in the image pickup device 118, each pixel including one of first phase-difference detection sub-pixels sl1, sl2, and sl3 and second phase-difference detection sub-pixels sr1, sr2, and sr3, and a plurality of light-receiving sub-pixels R, G, and B. Pixels including first phase-difference detection sub-pixels sl1, sl2, or sl3 are referred to as first group pixels G1, and pixels including second phase-difference detection sub-pixels sr1, sr2, or sr3 are referred to as second group pixels G2.

According to the current embodiment of the present invention, degrees of bias of confined light-receiving regions of first and second phase-difference detection sub-pixels sl1, sl2, sl3, sr1, sr2, sr3 may vary according to different regions of the image pickup device 118. As illustrated in FIG. 13C, in regions A, B, and C of the image pickup device 118, which respectively correspond to a center region of the image pickup device 118, a region biased to a first direction from an optical axis of the image pickup device 118, and a region biased to a second direction from the optical axis of the image pickup device 118, the confined light-receiving regions of first phase-difference detection sub-pixels sl1, sl2, and sl3 may have different arrangements, and those of second phase-difference detection sub-pixels sr1, sr2, and sr3 may have different arrangements.

In the region B biased to the first direction from the center of the image pickup device 118, a confined light-receiving region 212b of a first phase-difference detection sub-pixel sl2 may be arranged in the center of the first phase-difference detection sub-pixel sl2 or biased relatively less to the first direction, and a confined light-receiving region 214b of a second phase-difference detection sub-pixel sr2 may be arranged biased to the second direction. In an embodiment of the present invention, the further the second phase-difference detection sub-pixel sr2 is away from the center of the image pickup device 118 in the first direction, the further the confined light-receiving region 214b of a second phase-difference detection sub-pixel sr2 may be biased to the second direction.

In the region C biased to the second direction from the center of the image pickup device 118, a confined light-receiving region 212c of a first phase-difference detection sub-pixel sl3 may be arranged biased to the second direction, and a confined light-receiving region 214b of a second phase-difference detection sub-pixel sr3 may be arranged in the center of the second phase-difference detection sub-pixel sr3 or biased relatively less to the second direction. In an embodiment of the present invention, the further the first phase-difference detection sub-pixel sl3 is away from the center of the image pickup device 118 in the second direction, the further the confined light-receiving region 212c of a first phase-difference detection sub-pixel sl3 may be biased to the first direction.

In the region A, which is in the center of the center of the image pickup device 118, a confined light-receiving region 212*a* of a first phase-difference detection sub-pixel sl1 may be arranged biased to the first direction, and a confined light-receiving region 214*a* of a second phase-difference detection sub-pixel sr2 may be arranged biased to the second direction. The confined light-receiving region 212*a* of a first phase-difference detection sub-pixel sl1 in the region A may be arranged biased relatively less to the first direction compared to the confined light-receiving region 212*c* of a first phase-difference detection sub-pixel sl3 in the region C. The confined light-receiving region 214*a* of a second phase-difference detection sub-pixel sr1 in the region A may be arranged biased relatively less to the second direction compared to the confined light-receiving region 214*b* of a second phase-difference detection sub-pixel sr2 in the region B.

According to the current embodiment of the present invention, confined light-receiving regions of phase-difference detection sub-pixels may have different arrangements in different regions of the image pickup device 118 according to incident characteristics of optical signals in each region of the image pickup device 118. This may lead to high-performance phase-difference AF.

The embodiments of FIGS. 13A to 13C may apply to the fifth group pixels G5 and the sixth group pixels G6 in FIGS. 12A to 12C. That is, the confined light-receiving regions of the fifth group pixels G5 may be arranged in the centers of corresponding phase-difference detection sub-pixels if the phase-difference detection sub-pixels are located in a region of the image pickup device 118 in the third direction from the optical axis, or may be arranged biased to the third direction if the phase-difference detection sub-pixels are located in a region of the image pickup device 118 in the fourth direction from the optical axis. The confined light-receiving regions of the sixth group pixels G6 may be arranged in the centers of corresponding phase-difference detection sub-pixels if the phase-difference detection sub-pixels are located in a region of the image pickup device 118 in the fourth direction from the optical axis, or may be arranged biased to the fourth direction if the phase-difference detection sub-pixels are located in a region of the image pickup device 118 in the third direction from the optical axis.

The AF method according to embodiments of the present invention can also be embodied as computer readable codes on a computer readable recording medium. The computer readable recording medium is any data storage device that can store data that can be thereafter read by a computer system.

An example of the computer readable recording medium includes flash memory, or the like.

The device described herein may comprise a processor, a memory for storing program data and executing it, a permanent storage such as a disk drive, a communications port for handling communications with external devices, and user interface devices, including a display, keys, etc. When software modules are involved, these software modules may be stored as program instructions or computer readable codes executable on the processor on a computer-readable media such as read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion. This media can be read by the computer, stored in the memory, and executed by the processor.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the present invention could employ any number of conventional techniques for electronics configuration, signal processing and/or control, data processing, and the like. The words "mechanism" and "element" are used broadly and are not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. Numerous modifications and adaptations will be readily apparent to those skilled in this art without departing from the spirit and scope of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A digital photographing apparatus comprising:
   an optical system for focusing light incident from a subject;
   an image pickup device that photoelectrically converts the light incident through the optical system;
   a phase-difference auto-focusing (AF) unit for determining whether a current state is an in-focus state from a phase-difference detection signal generated by the image pickup device; and
   an interpolation unit for performing interpolation;
   wherein
   the image pickup device comprises an array of pixels having consecutive rows and consecutive columns over an entire region of the image pickup device, each pixel of the array of pixels consisting of a same 2×2 pattern of sub-pixels that comprises:
   a plurality of light-receiving sub-pixels that generate an image pickup signal from incident light; and
   a phase-difference detection sub-pixel having a confined light-receiving region and for generating and outputting the phase-difference detection signal;
   the interpolation unit performs interpolation on the plurality of light-receiving sub-pixels and the phase-difference detection sub-pixel;
   each sub-pixel of the plurality of light-receiving sub-pixels of a pixel has a different color from other sub-pixels of the plurality of light-receiving sub-pixels, and the interpolation unit performs interpolation on the light receiving sub-pixels of the same color using neighboring pixels of the same pattern over the entire region of the image pickup device, and performs interpolation on the phase-difference detection sub-pixels using neighboring pixels of the same pattern over the entire region of the image pickup device;
   the array of pixels comprises a first group of pixels and a second group of pixels, wherein each pixel of the array of pixels is classified in either the first group or the second group according to an arrangement of the confined light-receiving region of the phase-difference detection sub-pixel thereof; and
   the confined light-receiving region of the phase-difference detection sub-pixel of each pixel of the first group of pixels and the confined light-receiving region of the phase-difference detection sub-pixel of each pixel of the second group of pixels are arranged biased to opposite directions;
   the interpolation unit performs a uniform interpolation for each light-receiving sub-pixel and phase-difference detection sub-pixel of each pixel of the image pickup device;
   the interpolation unit, for a sub-pixel having a location in a sub-pixel column x and a sub-pixel row y defined by [x, y], performs interpolation using:
   i) a first interpolation pattern, a second interpolation pattern, and a third interpolation pattern if the sub-pixel is a phase-difference detection sub-pixel,
   ii) the first interpolation pattern and the third interpolation pattern if a phase-difference detection sub-pixel is in a same sub-pixel column as the sub-pixel,
   iii) the first interpolation pattern and the second interpolation pattern if a phase-difference detection sub-pixel is not in a same sub-pixel row and not in the same sub-pixel column as the sub-pixel, or
   iv) the second interpolation pattern and the third interpolation pattern if a phase difference detection sub-pixel is in the same sub-pixel row as the sub-pixel; and
   the sub-pixels for the first interpolation pattern have locations defined by [x±1, y±2] and [x±1, y], sub-pixels for the second interpolation pattern have locations defined by [x±2, y±1] and [x, y±1], and sub-pixels for the third interpolation pattern have locations defined by [x±1, y±1].

2. The digital photographing apparatus of claim 1, wherein the phase-difference AF processing unit determines whether the current state is in the in-focus state by detecting magnitudes of the phase-difference detection signals of the first group of pixels and the second group of pixels according to pixel regions of the image pickup device, and determines a direction in which to move a lens to be in the in-focus state.

3. The digital photographing apparatus of claim 1, wherein:
   the confined light-receiving region of each pixel of the first group of pixels is arranged biased to a first direction defined along a row direction;
   the confined light-receiving region of each pixel of the second group of pixels is arranged biased to a second direction opposite to the first direction; and
   the first group of pixels and the second group of pixels are each consecutively arranged in the row direction as a group, and the groups of the first group of pixels and the second group of pixels alternate in a column direction;
   the phase-difference AF processing unit determines that the current state is in the in-focus state if, in a region of the image pickup device that is on an optical axis, the phase-difference detection signal of the first group pixels and the phase-difference detection signal of the second group pixels are detected to be greater than or equal to a critical level; and
   if either the phase-difference detection signal of the first group pixels or the phase-difference detection signal of the second group pixels is detected to be less than the critical level,
   the phase-difference AF processing unit determines that the current state is in a front focus state if, in a region of the image pickup device biased to the first direction from the optical axis, the phase-difference detection signal of the second group pixels is detected to be greater than or equal to the critical level; and
   the phase-difference detection signal of the first group pixels is detected to be less than the critical level; and determines that the current state is in a back focus state if, in the region of the image pickup device biased to the first direction from the optical axis, the phase-difference detection signal of the first group pixels is detected to be greater than or equal to the critical level, and the phase-difference detection signal of the second group pixels is detected to be less than the critical level.

4. The digital photographing apparatus of claim 1, wherein:
   the array of pixels further comprise third group pixels and fourth group pixels that each are classified according to an arrangement of the confined light-receiving region of the phase-difference detection sub-pixel thereof;

the confined light-receiving region of the third group pixels is arranged biased further to the first direction relative to the confined light-receiving region of the first group pixels;

the confined light-receiving region of the fourth group pixels is arranged biased further to the second direction relative to the confined light-receiving region of the second group pixels;

the phase-difference AF processing unit determines whether the current state is in the in-focus state using the phase-difference detection signals of the first group pixels and the second group pixels in a first focal distance region, and using the phase-difference detection signals of the third group pixels and the fourth group pixels in a second focal distance region with a focal distance shorter than that in the first focal distance region.

5. The digital photographing apparatus of claim 1, wherein:

the array of pixels further comprise fifth group pixels and sixth group pixels that are each classified according to an arrangement of the confined light-receiving region of the phase-difference detection sub-pixel thereof;

the confined light-receiving region of the first group pixels is arranged biased to a first direction defined along a row direction;

the confined light-receiving region of the second group pixels is arranged biased to a second direction opposite to the first direction;

the confined light-receiving region of the fifth group pixels is arranged biased to a third direction defined along a column direction perpendicular to the row direction;

the confined light-receiving region of the sixth group pixels is arranged biased to a fourth direction opposite to the third direction;

wherein the phase-difference AF processing unit determines that the current state is in the in-focus state if, in a region of the image pickup device that is on an optical axis, the phase-difference detection signals of the first, second, fifth and sixth group pixels are detected to be greater than or equal to a critical level;

if the phase-difference detection signals of the first, second, fifth and sixth group pixels are detected to be less than the critical level, the phase-difference AF processing unit determines that the current state is in a front focus state if, in a region of the image pickup device biased to the first direction from the optical axis, the phase-difference detection signal of the second group pixels is detected to be greater than or equal to the critical level, and the phase-difference detection signal of the first group pixels is detected to be less than the critical level;

the phase-difference AF processing unit determines that the current state is in the front focus state if in a region of the image pickup device biased to the third direction from the optical axis the phase-difference detection signal of the sixth group pixels is detected to be greater than or equal to the critical level, and the phase-difference detection signal of the fifth group pixels is detected to be less than the critical level;

the phase-difference AF processing unit determines that the current state is in a back focus state if, in the region of the image pickup device biased to the first direction from the optical axis, the phase-difference detection signal of the first group pixels is detected to be greater than or equal to the critical level, and the phase-difference detection signal of the second group pixels is detected to be less than the critical level; and the phase-difference AF processing unit determines that the current state is in the back focus state if, in the region of the image pickup device biased to the third direction from the optical axis, the phase-difference detection signal of the fifth group pixels is detected to be greater than or equal to the critical level, and the phase-difference detection signal of the sixth group pixels is detected to be less than the critical level.

6. The digital photographing apparatus of claim 1, further comprising:

a contrast AF processing unit for extracting contrast information from an image pickup signal generated by a plurality of the light-receiving sub-pixels and determining whether the current state is in the in-focus state using the contrast information; and a lens driving unit for driving a lens of the optical system according to a result of the in-focus state determination by the phase-difference AF processing unit and a result of the in-focus state determination by the contrast AF processing unit.

7. An auto-focusing method of a digital photographing apparatus including an image pickup device, the auto-focusing method comprising:

determining whether a current state is in an in-focus state by detecting magnitudes of phase-difference detection signals of a first group of pixels and phase-difference detection signals of a second group of pixels according to pixel regions of the image pickup device, the image pickup device comprising an array of pixels having consecutive rows and consecutive columns over an entire region of the image pickup device, wherein each pixel of the array of pixels consists of a same 2×2 pattern of sub-pixels that comprises a plurality of light-receiving sub-pixels that generate an image pickup signal from incident light and a phase-difference detection sub-pixel having a confined light-receiving region, wherein the array of pixels comprises the first group of pixels and the second group of pixels, wherein each pixel of the array of pixels is classified in either the first group or the second group according to an arrangement of the confined light-receiving region of the phase-difference detection sub-pixel thereof, wherein the confined light-receiving region of the phase-difference detection sub-pixel of each pixel of the first group of pixels and the confined light-receiving region of the phase-difference detection sub-pixel of each pixel of the second group of pixels are arranged biased to opposite directions; and determining whether the current state is in a front focus state or in a back focus state if the current state is not in the in-focus state;

wherein each sub-pixel of the plurality of light-receiving sub-pixels of a pixel has a different color from other sub-pixels of the plurality of light-receiving sub-pixels, the auto-focusing method comprising:

performing interpolation on the light receiving sub-pixels using neighboring pixels of the same pattern over the entire region of the image pickup device; and performing interpolation on the phase-difference detection sub-pixels using neighboring pixels of the same pattern over the entire region of the image pickup device;

wherein performing the interpolation comprises performing a uniform interpolation for each light-receiving sub-pixel and phase-difference detection sub-pixel of each pixel of the image pickup device;

wherein:

for a sub-pixel having a location in a sub-pixel column x and a sub-pixel row y defined by [x, y], the interpolation is performed using:
  i) a first interpolation pattern, a second interpolation pattern, and a third interpolation pattern if the sub-pixel is a phase-difference detection sub-pixel,
  ii) the first interpolation pattern and the third interpolation pattern if a phase-difference detection sub-pixel is in a same sub-pixel column as the sub-pixel,
  iii) the first interpolation pattern and the second interpolation pattern if a phase-difference detection sub-pixel is not in a same sub-pixel row and not in the same sub-pixel column as the sub-pixel, or
  iv) the second interpolation pattern and the third interpolation pattern if a phase difference detection sub-pixel is in the same sub-pixel row as the sub-pixel; and
sub-pixels for the first interpolation pattern have locations defined by [x±1, y±2] and [x±1, y], sub-pixels for the second interpolation pattern have locations defined by [x±2, y±1] and [x, y±1], and sub-pixels for the third interpolation pattern have locations defined by [x±1, y±1].

8. The auto-focusing method of claim 7, wherein the confined light-receiving region of each pixel of the first group of pixels is arranged biased to a first direction defined along a row direction; the confined light-receiving region of each pixel of the second group of pixels is arranged biased to a second direction opposite to the first direction; and the first group of pixels and the second group of pixels are each consecutively arranged in the row direction as a group, and the groups of the first group of pixels and the second group of pixels alternate in a column direction, the auto-focusing method further comprising:
  determining that the current state is in the in-focus state if, in a region of the image pickup device that is on an optical axis, the phase-difference detection signal of the first group of pixels and the phase-difference detection signal of the second group of pixels are detected to be greater than or equal to a critical level;
  if, in the region of the image pickup device that is on the optical axis, the phase-difference detection signal of the first group of pixels and the phase-difference detection signal of the second group of pixels are detected to be less than the critical level,
  determining that the current state is in the front focus state if, in a region of the image pickup device biased to the first direction from the optical axis the phase-difference detection signal of the second group of pixels is detected to be greater than or equal to the critical level, and the phase-difference detection signal of the first group of pixels is detected to be less than the critical level; and
  determining that the current state is in the back focus state if, in the region of the image pickup device biased to the first direction from the optical axis, the phase-difference detection signal of the first group of pixels is detected to be greater than or equal to the critical level, and the phase-difference detection signal of the second group of pixels is detected to be less than the critical level.

9. The auto-focusing method of claim 7, wherein the array of pixels further comprise third group pixels and fourth group pixels that are each classified according to an arrangement of the confined light-receiving region of the phase-difference detection sub-pixel thereof; the confined light-receiving region of the third group pixels is arranged biased further to the first direction relative to the confined light-receiving region of the first group pixels; and the confined light-receiving region of the fourth group pixels is arranged biased further to the second direction relative to the confined light-receiving region of the second group pixels, the auto-focusing method further comprising:
  determining whether the current state is in the in-focus state using the phase-difference detection signals of the first group pixels and the second group pixels in a first focal distance region; and
  determining whether the current state is in the in-focus state using the phase-difference detection signals of the third group pixels and the fourth group pixels in a second focal distance region with a focal distance shorter than that in the first focal distance region.

10. The auto-focusing method of claim 7, wherein:
the array of pixels further comprise fifth group pixels and sixth group pixels that each are classified according to an arrangement of the confined light-receiving region of the phase-difference detection sub-pixel thereof;
the confined light-receiving region of the first group pixels is arranged biased to a first direction defined along a row direction;
the confined light-receiving region of the second group pixels is arranged biased to a second direction opposite to the first direction;
the confined light-receiving region of the fifth group pixels is arranged biased to a third direction defined along a column direction perpendicular to the row direction; and
the confined light-receiving region of the sixth group pixels is arranged biased to a fourth direction opposite to the third direction,
the auto-focusing method further comprising:
  determining that the current state is in the in-focus state if, in a region of the image pickup device that is on an optical axis, the phase-difference detection signals of the first, second, fifth and sixth group pixels are detected to be greater than or equal to a critical level; and
  if, in the region of the image pickup device that is on the optical axis, the phase-difference detection signals of the first, second, fifth and sixth group pixels are detected to be less than the critical level,
  determining that the current state is in the front focus state if, in a region of the image pickup device biased to the first direction from the optical axis, the phase-difference detection signal of the second group pixels is detected to be greater than or equal to the critical level, and the phase-difference detection signal of the first group pixels is detected to be less than the critical level,
  determining that the current state is in the front focus state if, in a region of the image pickup device biased to the third direction from the optical axis, the phase-difference detection signal of the sixth group pixels is detected to be greater than or equal to the critical level, and the phase-difference detection signal of the fifth group pixels is detected to be less than the critical level;
  determining that the current state is in the back focus state if, in the region of the image pickup device biased to the first direction from the optical axis, the phase-difference detection signal of the first group pixels is detected to be greater than or equal to the critical level, and the phase-difference detection signal of the second group pixels is detected to be less than the critical level; and
  determining that the current state is in the back focus state if, in the region of the image pickup device biased to the third direction from the optical axis, the phase-difference detection signal of the fifth group pixels is detected to be greater than or equal to the critical level, and the phase-difference detection signal of the sixth group pixels is detected to be less than the critical level.

11. The auto-focusing method of claim 7, further comprising:

extracting contrast information from the image pickup signal generated by a plurality of the light-receiving sub-pixels and determining whether the current state is in the in-focus state using the contrast information; and driving a lens according to a result of the in-focus state determination using the phase-difference detection signals, and a result of the in-focus state determination using the contrast information.

12. A non-transitory computer readable storage medium storing computer program codes for executing an auto-focusing method of a digital photographing apparatus including an image pickup device, the auto-focusing method comprising:

determining whether a current state is in an in-focus state by detecting magnitudes of phase-difference detection signals of a first group of pixels and phase-difference detection signals of a second group of pixels according to pixel regions of the image pickup device, the image pickup device comprising an array of pixels having consecutive rows and consecutive columns over an entire region of the image pickup device, wherein each pixel of the array of pixels consists of a same pattern of sub-pixels that comprises a plurality of light-receiving sub-pixels that generate an image pickup signal from incident light and a phase-difference detection sub-pixel having a confined light-receiving region, wherein the array of pixels comprises the first group of pixels and the second group of pixels, wherein each pixel of the array of pixels is classified in either the first group or the second group according to an arrangement of the confined light-receiving region of the phase-difference detection sub-pixel thereof, wherein the confined light-receiving region of the phase-difference detection sub-pixel of each pixel of the first group of pixels and the confined light-receiving region of the phase-difference detection sub-pixel of each pixel of the second group of pixels are arranged biased to opposite directions; and determining whether the current state is in a front focus state or in a back focus state if not in an in-focus state;

wherein each sub-pixel of the plurality of light-receiving sub-pixels of a pixel has a different color from other sub-pixels of the plurality of light-receiving sub-pixels, the auto-focusing method comprising:

performing interpolation on the light receiving sub-pixels using neighboring pixels of the same pattern over the entire region of the image pickup device; and performing interpolation on the phase-difference detection sub-pixels using neighboring pixels of the same pattern over the entire region of the image pickup device;

wherein performing the interpolation comprises performing a uniform interpolation for each light-receiving sub-pixel and phase-difference detection sub-pixel of each pixel of the image pickup device;

wherein:

wherein, for a sub-pixel having a location in a sub-pixel column x and a sub-pixel row v defined by [x, y], the interpolation is performed using:

i) a first interpolation pattern, a second interpolation pattern, and a third interpolation pattern if the sub-pixel is a phase-difference detection sub-pixel, ii) the first interpolation pattern and the third interpolation pattern if a phase-difference detection sub-pixel is in a same sub-pixel column as the sub-pixel, iii) the first interpolation pattern and the second interpolation pattern if a phase-difference detection sub-pixel is not in a same sub-pixel row and not in the same sub-pixel column as the sub-pixel, or iv) the second interpolation pattern and the third interpolation pattern if a phase difference detection sub-pixel is in the same sub-pixel row as the sub-pixel; and sub-pixels for the first interpolation pattern have locations defined by [x±1, y±2] and [x±1, y], sub-pixels for the second interpolation pattern have locations defined by [x±2, y±1] and [x, y±1], and sub-pixels for the third interpolation pattern have locations defined by [x±1, v±1].

13. A digital photographing apparatus comprising:

an optical system for focusing light incident from a subject;

an image pickup device that photoelectrically converts the light incident through the optical system;

a phase-difference auto-focusing (AF) unit for determining whether a current state is an in-focus state from a phase-difference detection signal generated by the image pickup device; and an interpolation unit for performing interpolation;

wherein the image pickup device comprises an array of pixels having consecutive rows and consecutive columns over an entire region of the image pickup device, each pixel of the array of pixels consisting of a same 2×2 pattern of sub-pixels that comprises:

a plurality of light-receiving sub-pixels that generate an image pickup signal from incident light; and a phase-difference detection sub-pixel having a confined light-receiving region and for generating and outputting the phase-difference detection signal;

the interpolation unit performs interpolation on the plurality of light-receiving sub-pixels and the phase-difference detection sub-pixel;

each sub-pixel of the plurality of light-receiving sub-pixels of a pixel has a different color from other sub-pixels of the plurality of light-receiving sub-pixels, and the interpolation unit performs interpolation on the light receiving sub-pixels of the same color using neighboring pixels of the same pattern over the entire region of the image pickup device, and performs interpolation on the phase-difference detection sub-pixels using neighboring pixels of the same pattern over the entire region of the image pickup device;

the array of pixels comprises a first group of pixels and a second group of pixels, wherein each pixel of the array of pixels is classified in either the first group or the second group according to an arrangement of the confined light-receiving region of the phase-difference detection sub-pixel thereof; and the confined light-receiving region of the phase-difference detection sub-pixel of each pixel of the first group of pixels and the confined light-receiving region of the phase-difference detection sub-pixel of each pixel of the second group of pixels are arranged biased to opposite directions;

the interpolation unit performs a uniform interpolation for each light-receiving sub-pixel and phase-difference detection sub-pixel of each pixel of the image pickup device;

the interpolation unit, for a sub-pixel having a location in a sub-pixel column x and a sub-pixel row y defined by [x, y], performs interpolation using:

i) a first interpolation pattern, a second interpolation pattern, and a third interpolation pattern if the sub-pixel is a phase-difference detection sub-pixel, ii) the first interpolation pattern and the third interpolation pattern if a phase-difference detection sub-pixel is in a same sub-pixel column as the sub-pixel, iii) the first interpolation pattern and the second interpolation pattern if a phase-difference detection sub-pixel is not in a same sub-pixel row and not in the same sub-pixel column as the sub-pixel, or iv) the second interpolation pattern and the third interpolation pattern if a phase difference detection sub-pixel is in the same sub-pixel row as the sub-pixel.

14. An auto-focusing method of a digital photographing apparatus including an image pickup device, the auto-focusing method comprising:

determining whether a current state is in an in-focus state by detecting magnitudes of phase-difference detection signals of a first group of pixels and phase-difference detection signals of a second group of pixels according to pixel regions of the image pickup device, the image pickup device comprising an array of pixels having consecutive rows and consecutive columns over an entire region of the image pickup device, wherein each pixel of the array of pixels consists of a same 2×2 pattern of sub-pixels that comprises a plurality of light-receiving sub-pixels that generate an image pickup signal from incident light and a phase-difference detection sub-pixel having a confined light-receiving region, wherein the array of pixels comprises the first group of pixels and the second group of pixels, wherein each pixel of the array of pixels is classified in either the first group or the second group according to an arrangement of the confined light-receiving region of the phase-difference detection sub-pixel thereof, wherein the confined light-receiving region of the phase-difference detection sub-pixel of each pixel of the first group of pixels and the confined light-receiving region of the phase-difference detection sub-pixel of each pixel of the second group of pixels are arranged biased to opposite directions; and determining whether the current state is in a front focus state or in a back focus state if the current state is not in the in-focus state;

wherein each sub-pixel of the plurality of light-receiving sub-pixels of a pixel has a different color from other sub-pixels of the plurality of light-receiving sub-pixels, the auto-focusing method comprising:

performing interpolation on the light receiving sub-pixels using neighboring pixels of the same pattern over the entire region of the image pickup device; and performing interpolation on the phase-difference detection sub-pixels using neighboring pixels of the same pattern over the entire region of the image pickup device;

wherein performing the interpolation comprises performing a uniform interpolation for each light-receiving sub-pixel and phase-difference detection sub-pixel of each pixel of the image pickup device;

wherein:

for a sub-pixel having a location in a sub-pixel column x and a sub-pixel row y defined by [x, y], the interpolation is performed using:

i) a first interpolation pattern, a second interpolation pattern, and a third interpolation pattern if the sub-pixel is a phase-difference detection sub-pixel, ii) the first interpolation pattern and the third interpolation pattern if a phase-difference detection sub-pixel is in a same sub-pixel column as the sub-pixel, iii) the first interpolation pattern and the second interpolation pattern if a phase-difference detection sub-pixel is not in a same sub-pixel row and not in the same sub-pixel column as the sub-pixel, or iv) the second interpolation pattern and the third interpolation pattern if a phase difference detection sub-pixel is in the same sub-pixel row as the sub-pixel.

* * * * *

UNITED STATES PATENT AND TRADEMARK OFFICE
CERTIFICATE OF CORRECTION

| | | |
|---|---|---|
| PATENT NO. | : 9,215,389 B2 | Page 1 of 1 |
| APPLICATION NO. | : 13/288156 | |
| DATED | : December 15, 2015 | |
| INVENTOR(S) | : Takafumi Usui | |

It is certified that error appears in the above-identified patent and that said Letters Patent is hereby corrected as shown below:

IN THE CLAIMS:

In Claim 12, Column 31, lines 57-58, replace "a sub-pixel column x and a sub-pixel row v defined by [x, y]" with -- a sub-pixel column x and a sub-pixel row y defined by [x, y] --

Signed and Sealed this
Twenty-ninth Day of March, 2016

Michelle K. Lee
*Director of the United States Patent and Trademark Office*